(12) United States Patent
Kawamura

(10) Patent No.: US 6,528,806 B1
(45) Date of Patent: Mar. 4, 2003

(54) CHARGED-PARTICLE-BEAM MICROLITHOGRAPHY APPARATUS, RETICLES, AND METHODS FOR REDUCING PROXIMITY EFFECTS, AND DEVICE-MANUFACTURING METHODS COMPRISING SAME

(75) Inventor: Yukisato Kawamura, Sagamihara (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/536,825

(22) Filed: Mar. 27, 2000

(30) Foreign Application Priority Data

Apr. 2, 1999 (JP) .............................. 11-095731

(51) Int. Cl.[7] .............................................. H01J 37/00
(52) U.S. Cl. .............................. 250/492.22; 250/492.1; 250/492.3; 250/396 R
(58) Field of Search .................. 250/492.1, 492.22, 250/492.3, 493.1, 493.2; 430/5, 22, 296

(56) References Cited

U.S. PATENT DOCUMENTS 5,422,491 A * 6/1995 Sakamoto .............. 250/492.22

OTHER PUBLICATIONS

Owen et al., "Proximity Effect Correction for Electron Beam Lithography by Equalization of Background Dose," *J. Appl. Phys.* 54:3573–3581 (1983).

* cited by examiner

*Primary Examiner*—John R. Lee
*Assistant Examiner*—David A. Vanore
(74) *Attorney, Agent, or Firm*—Klarquist Sparkman LLP

(57) ABSTRACT

Apparatus and methods are disclosed for reducing proximity effects in pattern elements as defined on a reticle and projected onto a wafer or other substrate. Especially reduced are proximity effects arising from pattern elements (located inside a pattern or chip field on the substrate) and an alignment mark (located outside a pattern or chip field on the substrate). To control these proximity effects, the distance between the alignment mark, as projected onto the substrate, and nearest pattern elements is controlled. Desirably, the alignment mark(s) are regarded as part of the overall pattern as projected, thereby allowing any of various proximity-effect-reducing techniques to be applied. For example, the substrate can be exposed with a patterning beam and a corrective beam. The corrective beam serves to "sensitize" the substrate and can be exposed not only within the chip field but also in perimeter zones located just outside the chip field on the substrate.

28 Claims, 15 Drawing Sheets

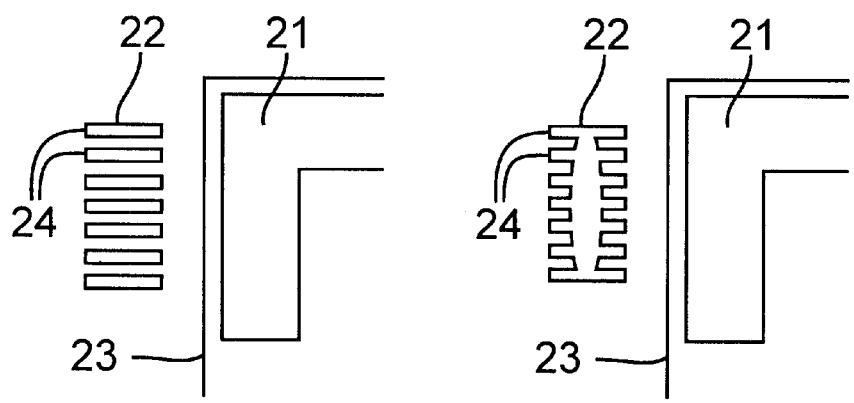
FIG. 6(a) (Prior Art)
FIG. 6(b) (Prior Art)
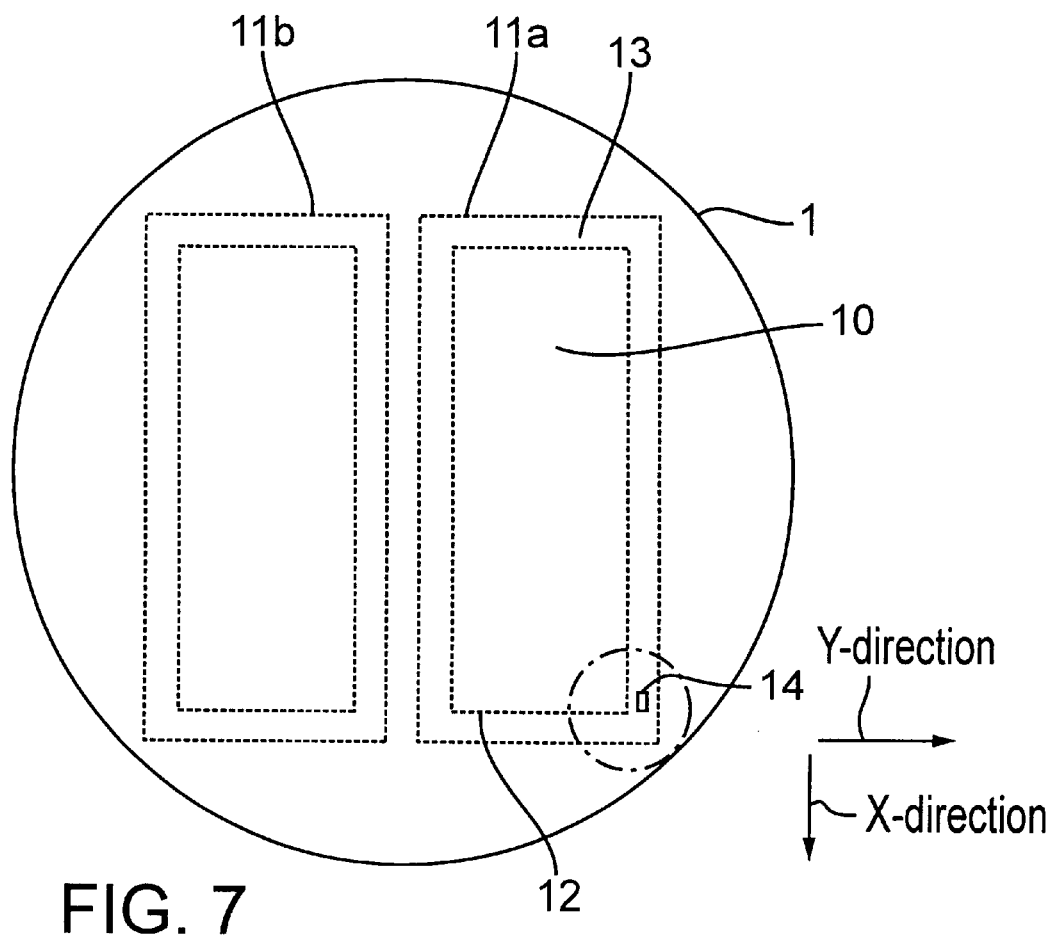
FIG. 7

CHARGED-PARTICLE-BEAM MICROLITHOGRAPHY APPARATUS, RETICLES, AND METHODS FOR REDUCING PROXIMITY EFFECTS, AND DEVICE-MANUFACTURING METHODS COMPRISING SAME

FIELD OF THE INVENTION

This invention pertains to microlithography (projection-transfer of a pattern, defined on a reticle or mask, to a substrate that is "sensitive" to the energy beam, used for the pattern transfer, in an image-forming way). Microlithography is a key technology used in the manufacture of semiconductor integrated circuits and displays. More specifically, the invention pertains to microlithography performed using a charged particle beam such as an electron beam, with correction of certain proximity effects.

BACKGROUND OF THE INVENTION

Most conventional microlithography utilizes light (especially ultraviolet light) as the energy beam for performing pattern transfer. Light-based microlithography is termed "optical" microlithography. However, as the complexity and miniaturization of electronic devices (e.g., microprocessors, memories, and displays) has continued to increase, the resolution limitations (arising from, e.g., diffraction phenomena) of optical microlithography is more and more problematic. Hence, considerable development effort is being expended to develop a practical microlithography technology that can achieve better resolution of pattern elements, especially at line-widths of 0.1 μm (100 nm) or less. To such end, utilization of other types of energy beams is being investigated for microlithography, including various charged particle beams such as an electron beam subjected to an acceleration voltage of several tens of KV to about 100 KV.

A charged-particle-beam (CPB) microlithography apparatus employs a charged particle beam (e.g., electron beam or ion beam) as an energy beam by which a pattern defined on a reticle is projection transferred to a suitable substrate ("wafer"). Certain aspects of a conventional CPB microlithography apparatus 80 are depicted schematically in FIG. 1. The FIG. 1 apparatus 80 employs a conventional reticle 90 that defines the pattern, and comprises an illumination unit 81, a reticle stage 82, a projection unit 83, a wafer stage 84, and a control unit 85.

The illumination unit 81 produces and directs a charged particle beam (e.g., electron beam) from a source toward the reticle stage 82. The reticle 90 is mounted to the reticle stage 82 such that the charged particle beam from the illumination unit 81 illuminates the reticle 90. The beam between the source and the reticle 90 is termed the "illumination beam" IB.

The reticle 90 "patterns" the charged particle beam in an image-forming way. Certain aspects of a conventional CPB reticle 90 are depicted schematically in FIG. 2, including an alignment pattern 91 and multiple nearby circuit elements 92 of a "chip" pattern. The illumination beam IB from the illumination unit 81 passing through the depicted region of the reticle 90 illuminates the alignment pattern 91 and the circuit elements 92. As the illumination beam IB passes through the depicted portion of the reticle 90, the beam is patterned according to the illuminated alignment pattern 91 and circuit elements 92. In this context, "patterned" means that the beam propagating downstream of the reticle 90 acquires an ability to form an image of the illuminated portion of the reticle.

The patterned beam PB propagates from the reticle 90 to the projection unit 83. The projection unit 83 is configured to deflect the patterned beam PB laterally as the beam propagates toward the wafer stage 84. The magnitude and direction of deflection is according to a command C input to the projection unit 83 from the control unit 85. The command C is an electrical signal encoding the desired position on the wafer 86 to which the patterned beam PB is to be deflected so as to expose the wafer 86.

The wafer 86 can be any suitable substrate but is usually a semiconductor wafer (e.g., silicon wafer), and hence the general term "wafer" is used herein. The upstream-facing surface of the wafer 86 is coated with a "resist" that is sensitive to exposure by the patterned beam. Thus, as the patterned beam PB impinges on the resist, the resist is imprinted with a latent image of the illuminated portion of the reticle 90. For exposure, the wafer 86 is mounted to the wafer stage 84. Typically, the wafer 86 is sufficiently large to accommodate multiple chips being formed on it, wherein each "chip" is destined to become a separate semiconductor device.

The control unit 85 is a device (e.g., microprocessor or analogous controller circuit) configured to control operation of the illumination unit 81 and the projection unit 83. For example, the control unit 85 controls the turning ON and OFF of emission of the charged particle beam by the illumination unit 81.

Thus, an image of the circuit elements 92 and an image of the alignment pattern 91 are "transferred" to the sensitized surface of the wafer 86. The image of the alignment pattern 91 is termed an "alignment mark."

In addition to control of minimum line-width, other crucial aspects of microlithography as applied to the manufacture of semiconductor devices are throughput and registration accuracy between the various layers of each chip that must interconnect accurately with each other in the chip. "Throughput" is the number of wafers that can be processed microlithographically per unit time.

In conventional mass-production of semiconductor devices in which optical microlithography is used, alignment marks are employed that are detected by an optical-based alignment-detection method such as LSA or FIA. Certain alignment marks are situated in spaces between chips as formed on the wafer, and are used for various purposes including ensuring accurate exposure position of each chip and accurate registration of the various layers in each chip with each other. Such alignment marks are also important in CPB microlithography.

CPB microlithography is subject to a phenomenon termed "proximity effects" as known in the art. With respect to elements as projected onto the wafer, proximity effects are manifest as, e.g., mis-shaped elements and reduced resolution of pattern elements situated proximally to each other. Proximity effects are caused largely by scattering of incident electrons within the resist and/or other materials on the wafer. Scattered electrons can have undesirable effects such as at least partial "exposure" of the resist in regions traversed by the scattered electrons, thereby degrading pattern-transfer accuracy and resolution. Therefore, correction of proximity effects is an important aspect of achieving practical CPB microlithography.

In CPB microlithography, the degree and extent of electron scattering from a point of incidence on the wafer is a function of the beam-acceleration voltage. I.e., as the acceleration voltage is increased, the depth and horizontal distance in the resist traversed by scattered electrons correspondingly increases. This phenomenon is depicted in FIGS. 3(a)–(b) in which the respective electron-scatter trace diagrams were created by a Monte Carlo simulator, and the hypothetical resist thickness was 0.5 $\mu$m on a silicon substrate. FIG. 3(a) is an electronscatter trace at a beam-acceleration voltage of 30 KV, and FIG. 3(b) is an electron-scatter trace at a beam-acceleration voltage of 100 KV. The abscissa (horizontal axis) is distance of lateral propagation from the point of incidence, and the ordinate (vertical axis) is depth from the point of incidence on the resist surface. As shown in FIG. 3(a), the lateral (horizontal) extent of electron scatter from the point of incidence is approximately 7 $\mu$m with an electron beam subjected to an acceleration voltage of 30 KV. The lateral scatter is 15 $\mu$m to 20 $\mu$m at an acceleration voltage of 50 KV (not shown), 35 $\mu$m to 40 $\mu$m at an acceleration voltage of 75 KV (not shown), and in excess of 65 $\mu$m at an acceleration voltage of 100 KV (FIG. 3(b)).

Hence, in CPB microlithography, whenever a wafer is exposed using an electron beam having an acceleration voltage on the order of several tens of KV to 100 KV or more, proximity effects can be substantial. Despite application of conventional methods for controlling proximity effects in CPB microlithography, especially such methods used to control proximity effects of actual pattern elements, proximity effects remain troublesome.

Conventionally, some correction of proximity effects of elements within chip boundaries usually is performed in CPB microlithography. Among various conventional approaches for correcting proximity effects are control and variation of the dose of the patterned beam on the wafer, use of multi-layer resists, pattern-biasing (reshaping and/or resizing of pattern elements), and "ghosting." An example background reference describing various conventional methods for correcting proximity effects is Owen and Rissman, "Proximity Effect Correction for Electron Beam Lithography by Equalization of Background Dose," *J. Appl. Phys.* 54(6):3573–3581, June 1983.

Of the conventional methods for correcting proximity effects, the technique of controlling and varying the dose of the patterned beam on the wafer requires that the scattering of electrons in the thickness dimension of the wafer be determined in advance in order to determine the dose variation needed for correction. This technique also is difficult to apply to CPB microlithography apparatus that scan the reticle and substrate in a raster manner during exposure. In the technique of using multi-layer resists, applying and developing the resists are complex. The technique of pattern biasing is problematic because it involves extremely intricate adjustments of pattern-element dimensions and highly complex calculations to determine which adjustments to make and where to apply them.

The conventional technique of correcting proximity effects by "ghosting" eliminates certain of the problems, listed above, encountered with other conventional methods of correcting proximity effects. In the ghosting technique, a defocused energy beam that has passed through a "corrective" reticle is irradiated onto the resist either before or after exposing the resist with an actual pattern defined by a conventional reticle. The ghosting exposure, in combination with the actual pattern exposure, results in a more even exposure overall from scattered electrons (i.e., an overall more uniform energy absorption by the resist).

In the most fundamental ghosting method, the energy beam is defocused by the horizontal distance into which the incident electrons will scatter in the resist. Within the boundary of a chip, the ghosting beam is irradiated onto regions of the wafer outside regions in which actual pattern elements have been or will be exposed. The ghosting dose normally is less than the dose used for exposing the pattern elements.

Conventionally, ghost exposures are performed at low beam-acceleration voltages that produce very little scattering of electrons in the resist. However, with current demand for higher-energy pattern-exposure beams, a need for correspondingly higher-energy ghost-exposure beams has become apparent.

A ghost exposure also causes scattering of electrons in the resist as a function of beam-acceleration voltage. Also, as the beam-acceleration voltage for pattern exposure is increased, the regions requiring a corrective ghost dose so as to achieve an overall more uniform energy absorption by the resist correspondingly expand.

At pattern-exposure beam energies sufficient to produce lateral scattering of several tens of $\mu$m, it has been found that proximity-effect correction at or near the boundaries of the chip fields is not achieved adequately. I.e., conventional methods do not provide a corrective irradiation field capable of making uniform the energy accumulation in the resist in regions just outside the boundary of the chip field. As pattern-exposure beam energies continue to increase, proximity-effect correction near the boundary of the chip field becomes increasingly difficult to achieve by conventional methods, producing unacceptable irregularities in the energy accumulation in the resist within chip boundaries. More specifically, as chip patterns are exposed at increasingly higher beam-acceleration voltages using conventional ghosting methods, with respect to pattern elements extending to a chip-field boundary, the area of the pattern at the chip-field boundary becomes unexpectedly thick or thin. This makes it difficult to expose an intricate pattern with acceptable accuracy according to the design specifications.

This point is explained in more detail with reference to FIGS. 4(a)–4(c) and 5(a)–5(b). FIG. 4(a) depicts a chip field 142 on a wafer 141 (i.e., on a substrate to which a coating of resist has been applied). FIG. 4(b) is an enlargement of the region of FIG. 4(a) in the vicinity of a corner point "A", according to design specifications. FIG. 4(c) is an enlargement of the region of FIG. 4(a) in the vicinity of the point "A" after wafer processing using conventional methods. FIG. 5(a) shows exemplary elements of the pattern, as defined on a conventional "patterning reticle" 145, in the vicinity of a point "A'", and FIG. 5(b) shows a conventional "ghosting reticle" 146 in the vicinity of the point "A'". (Point A' in FIGS. 5(a) and 5(b) corresponds with the point A in FIGS. 4(a)–4(c).) For purposes of discussion, the wafer 141 is understood to be coated with a negative resist.

Normally, exposure of a chip field 142 is performed by the patterned beam within the boundaries 140 of the chip field 142. As shown in FIG. 4(a), the chip fields 142 are arrayed in two dimensions on the wafer 141 with specified gaps between them. In FIG. 4(b), the regions denoted by the numeral 143 are elements of the chip pattern actually exposed by the patterned beam. The regions 143 conventionally are not exposed by the corrective beam. The regions denoted by the numeral 144 are regions of the chip pattern exposed by the corrective beam. The regions 144 conventionally are not exposed by the patterned beam.

To achieve the type of exposure on the wafer as shown in FIGS. 4(b)–4(c), a "patterning reticle" 145 (such as shown in FIG. 5(a)) is used for exposure using the patterned beam, and a "corrective" (e.g., ghosting) reticle 146 (such as shown in FIG. 5(b)) is used for exposure using the corrective beam.

As is usual with CPB microlithography, the chip field 142 is not exposed all at the same instant. Rather, the patterning reticle 145 is divided (segmented) into multiple subfields (not shown) arranged in a two-dimensional array on the patterning reticle 145. The corrective reticle 146 is divided similarly. Also, even though the image produced by passage of the patterned beam PB through the projection unit 83 (FIG. 1) is reversed, FIGS. 5(a)–5(b) do not indicate such reversal in the interest of simplifying this discussion.

FIG. 5(a) shows a portion of a subfield 147 on the patterning reticle 145 that corresponds to the subfield in the upper-left corner of the chip field 142 (FIG. 4(b)) and including point A. FIG. 5(b) shows a portion of a subfield 148 on the corrective reticle 146 that corresponds with the subfield in the upper-left corner of the chip field 142 (FIG. 4(b)) and including point A.

Even though not shown, the elements of the respective patterns defined by the reticles 145 and 146 are defined in part by scattering bodies exhibiting a large beam-scattering angle. I.e., the reticles 145, 146 are "scattering-membrane" reticles as known in the art. In FIG. 5(a), regions denoted by the numeral 149 are regions in which no scattering body is present; scattering bodies are present in the intervening regions. Hence, in FIG. 4(b), the regions denoted by the numeral 143 are exposed by the patterned beam passing through the regions 149. Similarly, in FIG. 5(b), regions denoted by the numeral 150 are regions in which no scattering body is present; scattering bodies are present in the intervening regions. Hence, in FIG. 4(b), the regions denoted by the number 144 are exposed by the beam passing through the regions 150.

Alternatively to scattering-membrane reticles, each of the reticles 145, 146 can be a respective stencil reticle.

In a conventional ghosting method, the regions 144 in FIG. 4(b) are exposed using a "corrective" beam (set to provide an irradiation dose that is smaller than the dose provided by the patterning beam) passing through the reticle 146. Exposure of the regions 144 is made either before or after exposure of the regions 143 in FIG. 4(b) using the patterning beam passing through the reticle 145. If the beam-acceleration voltage used for exposing the pattern is at a level where lateral scattering of electrons in the resist is several tens of μm, then not providing a corrective irradiation field to even out the energy accumulation (in the resist) in zones immediately outside the boundaries of the chip field 42 makes it impossible to achieve an adequate proximity-effect correction in the vicinity just inside the boundaries of the chip field. As a result, when the wafer 141 is developed after exposure, pattern elements 151 that (according to FIG. 4(b)) should extend to the boundary of the chip field 142 fail to do so, as shown in FIG. 4(c).

Another aspect of proximity-effect control that conventionally is not addressed is the incidence of proximity effects between a peripheral alignment mark on the wafer (outside the edge of the chip field) and nearby pattern elements within the boundary of a neighboring chip. By way of example, FIG. 6(a) depicts a situation in which an alignment mark 22 (consisting of multiple elements 24) is situated outside and adjacent a chip boundary 23. During actual exposure and development, due to the proximity of the alignment mark 22 to the chip boundary 23, the line-width of the elements 24 of the alignment mark 22 can be altered undesirably. Such a change to the alignment mark 22 degrades the line-width accuracy of the alignment mark and causes problems, depending on the circumstances, such as elements 24 of the alignment mark touching each other, etc. FIG. 6(b) shows adjacent elements 24 of an alignment mark 22, as exposed onto the wafer, touching each other, as caused by the proximity of the mark 22 to the adjacent element 21 of the nearby chip. If such a mark, as projected, is used to ascertain registration of a subsequently applied layer to the chips on the wafer, registration accuracy is decreased, which lowers the yield of chips from the wafer that are within specifications. This kind of problem can arise regardless of steps taken to reduce proximity effects on pattern elements within the chip boundaries.

Also, just as elements of a chip pattern inside a chip boundary can exhibit an undesirable proximity effect on nearby alignment marks situated outside the chip boundaries, the presence of alignment marks outside a chip boundary can exhibit an undesirable proximity effect on nearby elements of the chip pattern inside the chip boundary.

Conventional methods for proximity-effect correction do not correct proximity effects imparted to images of circuit elements, as projected onto the wafer, by an image of an adjacent alignment pattern. As a result, the profiles of pattern elements as projected onto the wafer frequently are distorted by proximity effects caused by the image of the adjacent alignment pattern.

SUMMARY OF THE INVENTION

In view of the shortcomings of the prior art summarized above, an object of the invention is to provide charged-particle-beam (CPB) microlithography (projection-exposure) apparatus and reticles that do not exhibit distortion of the images of circuit elements that are situated adjacent an alignment mark.

To such end, and according to a first aspect of the invention, microlithographic reticles are provided. A first example embodiment of a reticle comprises a pattern field and at least one alignment subfield. The pattern field comprises multiple circuit subfields in which are disposed respective circuit elements of a circuit pattern defined by the reticle. The alignment subfield includes a respective alignment pattern. The alignment subfield is disposed outside the pattern field but adjacent a respective circuit subfield. The alignment subfield can be disposed at a position at which the respective alignment pattern would be exposed onto a scribe line of the pattern. The reticle can comprise multiple alignment subfields disposed at respective positions around the pattern field. The alignment pattern can be disposed at a distance, from an adjacent boundary of the alignment subfield, that is a function of the magnitude of a proximity effect otherwise imparted to the circuit pattern by an exposure dose applied to the alignment pattern.

In a second example embodiment, the pattern field in a reticle as summarized above is circumscribed by a pattern-field boundary collectively defined by respective sides of peripheral circuit subfields of the pattern field. In such a configuration, the alignment pattern is situated a distance, from an adjacent portion of the pattern-field boundary, that is a function of the magnitude of the proximity effect otherwise imparted to the circuit pattern by an exposure dose applied to the alignment pattern.

A third representative embodiment of a reticle according to the invention comprises circuit elements to be exposed onto a wafer by a charged particle beam. The reticle also includes an alignment pattern to be exposed onto the wafer by the charged particle beam. The alignment pattern is disposed adjacent respective circuit elements but at a distance, from the adjacent circuit elements, that is a function of a magnitude of proximity effect otherwise imparted to the circuit elements by an exposure dose applied to the alignment pattern. The proximity effect otherwise imparted to the circuit elements generally is of a magnitude that would be manifest on circuit elements larger than a threshold size.

A fourth example embodiment of a reticle according to the invention comprises a pattern field and a scribe area. The pattern field is segmented into multiple pattern subfields each defining a respective portion of a pattern defined by the pattern field. Each respective portion comprises at least one respective pattern element. The scribe area surrounds the pattern field and comprises at least one alignment subfield defining an alignment-mark pattern. The alignment subfield is situated adjacent the closest pattern subfield situated in the pattern field. The distance at which the alignment-mark pattern is located from the respective elements defined in the closest pattern subfield desirably is greater than a threshold value sufficient to maintain a proximity effect of the respective elements and the alignment mark with each other below a target magnitude.

According to another aspect of the invention, charged-particle-beam (CPB) microlithography apparatus are provided. Such apparatus are used for transferring a pattern, defined by a reticle segmented into circuit subfields, and at least one alignment subfield from the reticle to a sensitive substrate. An example embodiment of such an apparatus comprises an illumination system, a projection system, and a controller. The illumination system is configured and situated to illuminate the circuit subfields and alignment subfield on the reticle with a charged particle beam. The projection system is configured and situated to deflect the charged particle beam, propagating from the alignment subfield, to a substrate. The alignment subfield, which defines an alignment mark, is situated adjacent a respective circuit subfield that defines a respective pattern element. The controller is connected to the projection system and is configured to cause the projection system to deflect the charged particle beam propagating from the alignment subfield. The magnitude of the deflection is a function of the proximity effect that would otherwise be manifest between the pattern element in the adjacent circuit subfield and the alignment mark due to an exposure dose applied to the alignment mark. The controller can be configured to cause the projection system to deflect the charged particle beam from the alignment subfield to a position, on the substrate, relative to a projected position of the adjacent circuit subfield where the proximity effect is less than a threshold value. The controller alternatively can be configured to cause the projection system to deflect the charged particle beam from the alignment subfield so as to project an image of the alignment mark onto the substrate at a position, relative to a projected position of the pattern element defined in the adjacent circuit subfield, where the proximity effect is less than a threshold value.

According to another aspect of the invention, methods are provided for manufacturing a semiconductor device. An example embodiment of such a method comprises any of various wafer-processing steps in combination with a step in which a pattern is exposed onto a resist layer using a CPB microlithography apparatus according to the invention.

According to yet another aspect of the invention, methods are provided, in conjunction with methods for performing microlithography of a circuit pattern (defined on a segmented reticle) onto a sensitive substrate using a charged particle beam, for reducing proximity effects. In such a proximity-effect-reducing method, a reticle is provided that comprises a pattern field including multiple circuit subfields in which are disposed respective circuit elements of a circuit pattern defined by the reticle. The reticle also includes at least one alignment subfield in which a respective alignment pattern is disposed. The alignment subfield is disposed outside the pattern field but adjacent a respective circuit subfield. The respective adjacent circuit subfield is projected onto the sensitive substrate. The alignment subfield is projected onto the sensitive substrate such that a projected image of the alignment pattern is located a distance from elements defined by the respective adjacent circuit subfield at which a proximity effect of the elements with the alignment pattern is maintained below a pre-determined threshold level. In this method, the circuit subfields can be projected into a pattern field on the substrate, and the alignment subfield can be projected into a scribe area that surrounds the pattern field on the substrate. The alignment subfield can be projected into the scribe area such that an edge of the alignment subfield is located a prescribed distance from a proximal edge of the adjacent circuit subfield.

According to another example method for reducing proximity effects arising from backscattering of electrons in the substrate, a corrective reticle is provided that corresponds to a patterning reticle (the patterning reticle defines the elements of the pattern). From the patterning reticle, the pattern elements are projected into a chip field as formed by the pattern elements on the substrate. A charged particle beam is irradiated through the corrective reticle onto the substrate such that the beam irradiating the substrate is incident on at least a portion of a perimeter zone located outside the chip field as projected onto the substrate. The method can further comprise the step of establishing a width of the perimeter zone based on an acceleration voltage of the charged particle beam incident on the reticle.

According to another aspect of the invention, corrective reticles are provided for reducing proximity effects in a chip field as projected onto a sensitive substrate using a charged particle beam. The corrective reticle desirably is configured to mask and transmit respective portions of the charged particle beam such that the transmitted portion of the beam irradiates at least a portion of a perimeter zone located outside the chip field as projected onto the substrate. The corrective reticle can be configured to pass a perimeter-zone-illuminating portion of the charged particle beam. Such a perimeter-zone-illuminating portion has a width, as irradiated onto the substrate, that is a function of an acceleration voltage applied to the beam irradiating the corrective reticle.

According to yet another aspect of the invention, methods are provided, in the context of methods for performing charged-particle-beam microlithography of a pattern, defined in a chip pattern on a reticle, to a sensitive substrate, for forming an alignment mark on the substrate. An example embodiment of such a method includes the step of establishing a chip-pattern area on the sensitive substrate in which an image of the chip pattern, as defined on the reticle, is exposed. An alignment mark is defined on a reticle. Using the charged particle beam, an image of the alignment mark is exposed onto the substrate. The image of the alignment mark is exposed at a location, outside the image of the chip pattern, situated at least a pre-determined threshold distance from the image of the chip pattern. The threshold distance is sufficient to maintain a magnitude of proximity effects of the image of the alignment mark with features of the chip pattern below a threshold level. For example, if the charged particle beam is an electron beam, the threshold distance ($\delta_d$, in $\mu$m) is determined to be $A_v$–35, wherein $A_v$ is an acceleration voltage (in KV) applied to the charged particle beam as used for exposure.

According to yet another aspect of the invention, methods are provided, in the context of performing charged-particle-beam microlithography of a pattern, defined in a chip pattern on a reticle, to a sensitive substrate, for reducing proximity effects arising between an alignment mark, located outside the chip pattern, and one or more elements of a pattern as exposed onto the substrate. In general, in such methods, proximity-effect corrections are performed considering the alignment mark and the chip pattern as a single unit. This allows proximity-effect correction to be performed by any of various techniques, such as by reshaping one or more of the alignment mark and an element of the chip pattern; controlling a dose of the charged particle beam as incident on the substrate; or ghosting.

The foregoing and other features and advantages of the invention will be more readily apparent from the following detailed description, which proceeds with reference to the accompanying drawings.

BRIEF DESCRIPTION OF THE DRAWINGS

FIG. 4(a) depicts a chip field on the wafer; FIG. 4(b) is an enlargement of the region of FIG. 4(a) in the vicinity of a corner point "A"; and FIG. 4(c) is an enlargement of the region of FIG. 4(a) in the vicinity of the point "A" after wafer processing.

FIGS. 6(a)–6(b) are schematic plan views of a region on a wafer to illustrate conventional experience with proximity effects on an alignment mark situated outside and adjacent a chip boundary. FIG. 6(a) depicts the ideal configuration of the alignment mark (consisting of multiple elements), and FIG. 6(b) shows the result of a proximity effect on the configuration of the alignment mark as exposed onto the wafer.

FIG. 7 is a schematic plan view of a certain features on the upstream-facing surface of a reticle according to Representative Embodiment 1.

FIG. 22(a) depicts a chip field on the wafer; FIG. 22(b) is an enlargement of the region of FIG. 22(a) in the vicinity of a corner point "A"; and FIG. 22(c) is an enlargement of the region of FIG. 22(a) in the vicinity of the point "A" after wafer processing.

DETAILED DESCRIPTION

The various aspects of the invention are described below in the context of representative embodiments. It will be understood that the invention is not limited to these particular embodiments.

Representative Embodiment 1

A reticle according to this embodiment is a member that defines elements of a pattern (e.g., a circuit pattern) to be exposed onto a "wafer" (as defined herein). The wafer includes an upstream-facing planar surface to which a suitable "resist" is applied so that the wafer is imprintable with the pattern elements defined on the reticle. Such a surface is termed herein the "sensitive surface."

Figure 10:
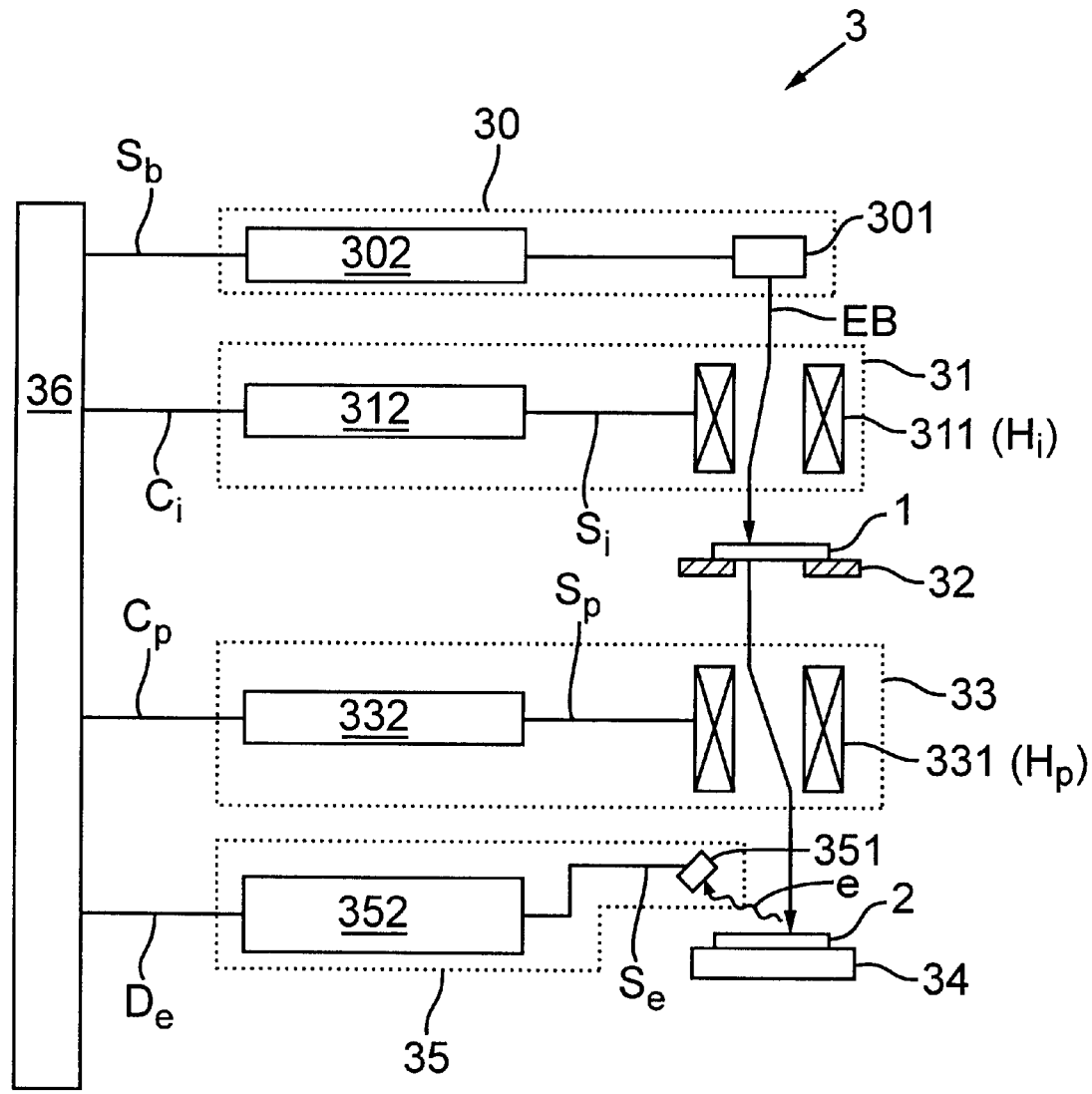
FIG. 10 is a functional block diagram of the CPB microlithography apparatus as described in Representative Embodiment 1.

Certain aspects of a reticle according to this embodiment are shown in FIG. 7, which schematically depicts, for example, two regions 10 each defining a pattern for one "chip" on the wafer. The reticle 1 of FIG. 7 can be used in a CPB microlithography apparatus as shown in FIG. 10 (described later below) that exposes a "reduced" (demagnified) image of a chip pattern, as defined on the reticle 1, onto the sensitive surface 20 of a wafer 2 using a charged particle beam (e.g., electron beam).

Figure 8:
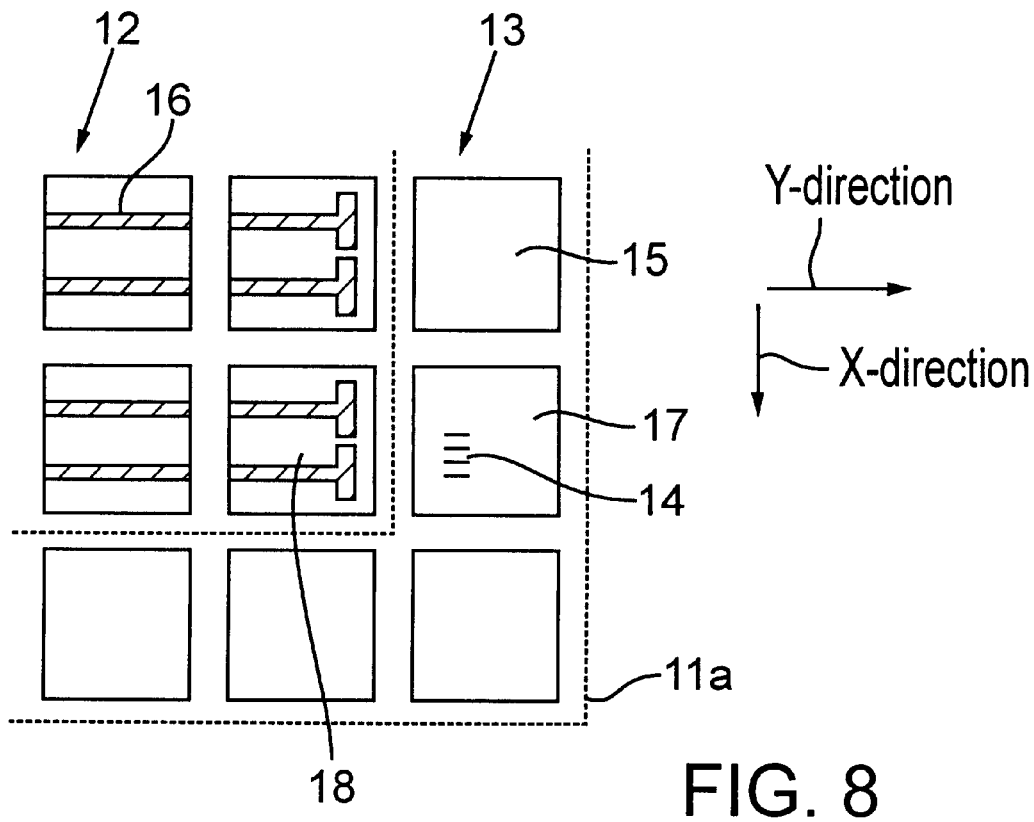
FIG. 8 depicts an enlargement of detail of the area of FIG. 7 within the dot-dash circle.
Figure 9:
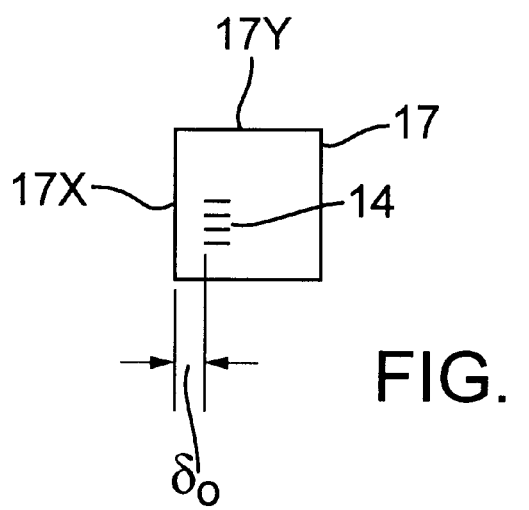
FIG. 9 depicts a portion of FIG. 8 (including the alignment-mark pattern) in even greater detail.

More specifically, FIG. 7 shows the reticle 1 as viewed from an upstream direction. FIG. 8 depicts an enlargement of detail of the area of FIG. 7 within the dash-dot circle. FIG. 9 depicts a portion of FIG. 8 in even greater detail.

The reticle of FIG. 7 includes two pattern fields 11a, 11b. Each pattern field 11a, 11b defines respective elements of a pattern 10 to be exposed onto the wafer. Each pattern 10 contains an extensive array of extremely small pattern elements that are not detailed in the figure. The pattern 10 situated in the pattern field 11a and the pattern 10 situated in the pattern field 11b have a complimentary relationship to one another. Each pattern field 11a, 11b has a rectangular outer profile, wherein the long sides extend in the X-direction and the short sides extend in the Y-direction.

Referring to the pattern field 11a by way of example, the pattern field 11a includes a circuit-pattern area 12 and a scribe area 13. The circuit-pattern area 12 is an area in which the pattern elements 10 for a layer of a single chip are defined. The scribe area 13 surrounds the circuit-pattern area 12 and contains "scribe lines" which are lines along which individual chips are cut from the wafer after wafer processing is complete. Consequently, features of the patterns 10 disposed in the circuit pattern area 12 will be exposed onto actual chips. Any features situated in the scribe area 13 will be exposed onto areas of the wafer that are cut out when the wafer is cut into individual chips.

Inside the dash-dot circle in FIG. 7 is a fine-alignment pattern 14 situated in the scribe area 13 of the pattern area 11a. The fine-alignment pattern 14 is used to form, by projection-exposure, corresponding fine-alignment marks 22 on the sensitive surface 20. The fine-alignment marks 22 are used as reference marks for accurately measuring the positions of points on the sensitive surface 20. Because the fine-alignment pattern 14 is disposed in the scribe area 13, the fine-alignment pattern 14 is exposed onto a corresponding scribe line 21 on the wafer 2.

The scribe area 13 need not contain only a single fine-alignment pattern 14; multiple fine-alignment patterns 14 can be disposed in the scribe area 13. Multiple fine-alignment patterns 14 permit more accurate position measurements than normally possible using only one fine-alignment pattern 14.

No fine-alignment patterns 14 are disposed in the pattern field 11b. The pattern in the pattern field 11b is complimentary to the pattern 10 in the pattern field 11a. Hence, features of the pattern 10 in the pattern field 11a have the same respective profiles as features of the pattern 10 in the pattern field 11b. In view of these similarities, details of the pattern field 11a are described below, and details of the pattern field 11b are omitted to avoid redundancy.

As shown in FIG. 8, multiple reticle subfields 15 are disposed in a regular array in the circuit-pattern area 12 and in the scribe area 13. The reticle subfields 15 are individual areas separately irradiated by the illumination beam. The shapes and sizes of the various reticle subfields 15 are substantially identical. Desirably, the shape of an individual reticle subfield is square.

Circuit elements 16 are disposed in the reticle subfields 15 in the circuit-pattern area 12. Each circuit element 16 is a respective portion of the overall pattern 10 of a circuit to be exposed onto the sensitive surface 20. A "reshaping correction" is performed with any of various circuit elements 16 based on the proximity effect that occurs whenever multiple circuit elements 16 are exposed onto the sensitive surface 20.

The reticle subfields 15 of the scribe area 13 are disposed at positions adjacent the reticle subfields 15 of the circuit-pattern area 12. Consequently, the reticle subfields 15 of the scribe area 13 are disposed within the pattern field 11a but peripherally to the circuit-pattern area 12.

A fine-alignment pattern 14 is disposed in one of the reticle subfields 15 arrayed in the X-direction in the scribe area 13. The reticle subfield 15 in which the fine-alignment pattern is disposed is termed an "alignment subfield" 17. Circuit elements 16 are not defined in the alignment subfield 17. The reticle subfield 15, within the circuit-pattern area 12, adjacent to the alignment subfield 17 is termed the "adjacent reticle subfield" 18.

An alignment subfield 17 is explained further with reference to FIG. 9. Of the four sides of the alignment subfield 17, the side that is parallel to the X-direction and proximal to the adjacent reticle subfield 18 is termed the "side 17X." The fine-alignment pattern 14 is disposed at a position separated, in the Y-direction, from the side 17X by a distance of only $\delta_0$. The distance $\delta_0$ is the shortest distance between the side 17X and the fine-alignment pattern 14.

Figure 11:
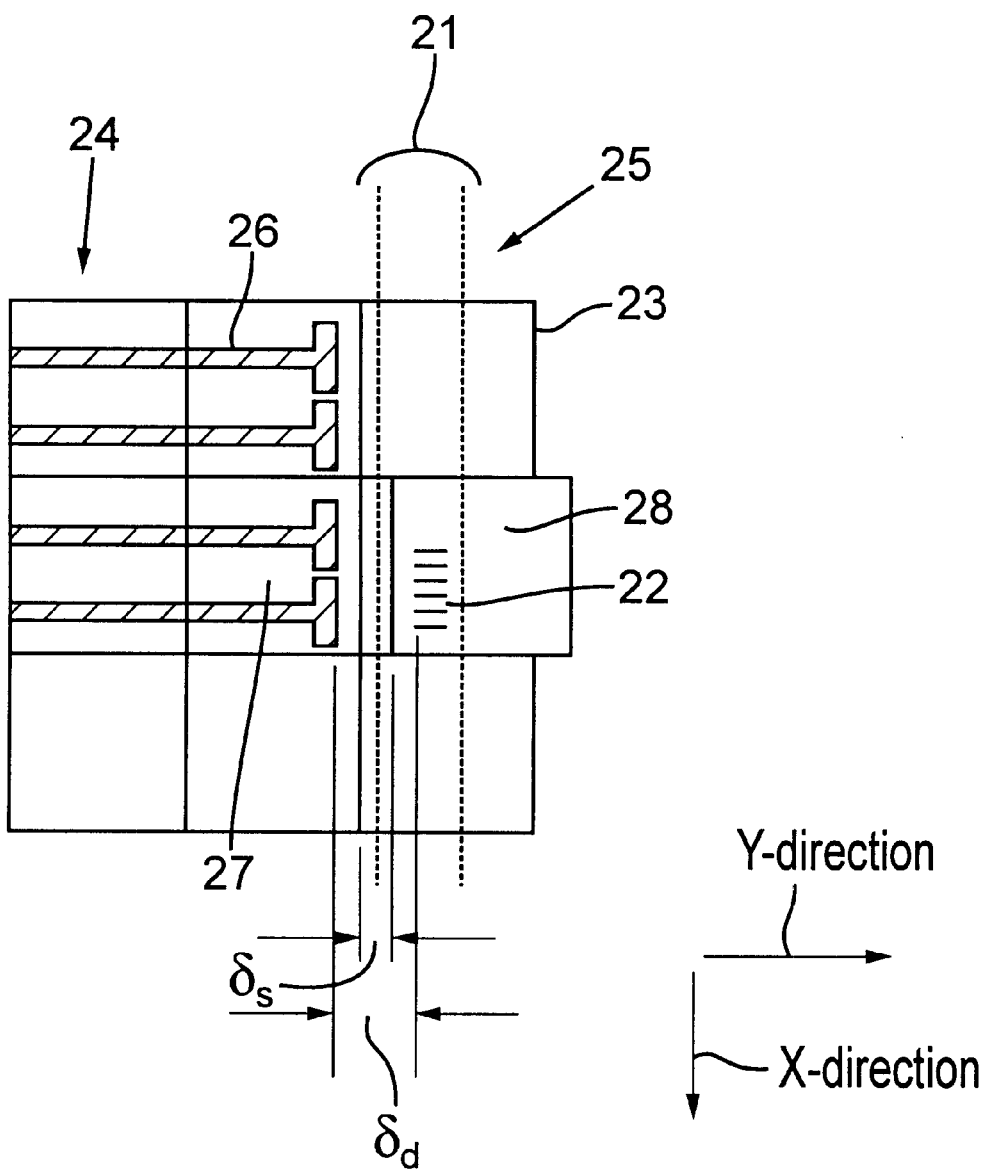
FIG. 11 is a schematic plan view of a "circuit-exposure area" and "scribe-exposure area" on a wafer exposed using the reticle of FIGS. 7–9.

The reticle 1 described above is mounted in a CPB microlithography apparatus 3 such as shown in FIG. 10. FIG. 10 depicts various details of the apparatus in a functional block-diagram format. FIG. 11 shows details of the sensitive surface 20 of a wafer 2 exposed with the reticle shown in FIG. 8.

The FIG. 10 apparatus comprises a CPB source 30, an illumination deflector 31, a reticle stage 32, a projection deflector 33, a wafer stage 34, a backscattered-electron (BSE) detector 35, and a central controller 36.

The CPB source 30 generates a charged particle beam EB (in this example, the charged particle beam is an electron beam). The CPB source 30 comprises an electron gun 301 and a gun-energizing circuit 302. The electron gun 301, when energized, emits the electron beam EB (as a representative charged particle beam) toward the illumination deflector 31. The gun-energizing circuit 302 controls emission of the electron beam EB by the electron gun 301. The gun-energizing circuit 302 receives a blanking signal $S_b$ from the central controller 36. Upon receiving the blanking signal $S_b$, the gun-energizing circuit 302 stops the electron gun 301 from emitting the electron beam EB. Whenever a blanking signal $S_b$ is not being input to the gun-energizing circuit 302, the electron gun 301 emits the electron beam EB.

The illumination deflector 31 selectively deflects the electron beam EB from the electron gun 301 to individual subfields 15 of the reticle 1. The illumination deflector 31 comprises a deflector coil 311 and a deflector-energization circuit 312 connected to the deflector coil 311. The deflector coil 311 generates a respective electromagnetic illumination-deflection field $H_i$ according to a coil-energization signal $S_i$. The deflector-energization circuit 312 generates the coil-energization signal $S_i$, based on a corresponding illumination-deflection command $C_i$ input from the central controller 36. The illumination-deflection command $C_i$ encodes the position of the reticle subfield 15 to be illuminated by the electron beam at a given instant. The deflector-energization circuit 312 generates the coil-energization signal $S_i$ based on the illumination-deflection command $C_i$.

The electron beam EB, deflected by the illumination-deflection field $H_i$, illuminates the particular reticle subfield 15 encoded by the illumination-deflection command $C_i$.

The reticle 1 is mounted to the reticle stage 32. As the electron beam EB illuminates a selected subfield 15, a portion of the beam passes through the illuminated subfield 15 and becomes a corresponding "patterned beam" that is "shaped" by the arrangement of pattern elements in the illuminated subfield. In other words, an electron beam that has illuminated a reticle subfield 15 within the circuit-pattern area 12 is "shaped" or "patterned" according to the particular arrangement and profiles of the constituent circuit elements 16 in that subfield. Similarly, an electron beam that has illuminated an alignment subfield 17 within the scribe area 13 is "shaped" or "patterned" according to the particular arrangement and profiles of the respective fine-alignment pattern 14. The patterned beam propagates from the reticle 1 to the projection deflector 33.

The projection deflector 33 deflects the patterned beam toward a pre-selected region on the sensitive surface 20 of the wafer 2 as the wafer 2 is held by the wafer stage 34. The projection deflector comprises a respective deflector coil 331 and a respective deflector-energization circuit 332. The deflector coil 331 generates an electromagnetic projection-deflection field $H_p$ that deflects the patterned beam based on a coil-energization signal $S_p$. The deflector-energization circuit 332 generates the coil-energization signal $S_p$ based on a corresponding projection-deflection command $C_p$ input from the central controller 36. The projection-deflection command $C_p$ encodes the respective position of a pre-selected wafer subfield to be exposed by the patterned beam. (A "wafer subfield" is an area on the sensitive surface 20 onto which a particular reticle subfield 15 is imaged by the patterned beam.) The deflector-energization circuit 332 generates the coil-energization signal $S_p$ based on the corresponding projection-deflection command $C_p$. Thus, the patterned beam deflected by the projection-deflection field $H_p$ exposes a particular wafer subfield 23 according to the projection-deflection command $C_p$.

As the sensitive surface of the wafer 2 is exposed to the patterned beam, electrons "e" are emitted from the sensitive surface 20. The electrons e propagate to the BSE detector 35 which is configured to detect the emitted electrons e. The BSE detector 35 comprises a BSE sensor 351 and a BSE-detection circuit 352. The BSE sensor 351 is configured to generate a BSE-detection signal $S_e$ corresponding to the quantity of backscattered electrons e emitted from the photosensitive surface 20 and captured by the BSE sensor 351. The BSE-detection circuit 352 converts the analog BSE-detection signal $S_e$ into corresponding digital BSE data $D_e$.

The central controller 36 is a microprocessor or analogous circuit configured to control the CPB source 30, the illumination deflector 31, the projection deflector 33, and the BSE detector 35. The central controller 36 also performs other functions. For example, the central controller 36 outputs the blanking signal $S_b$ to the gun-energizing circuit 302. The central controller 36 outputs the illumination-deflection command $C_i$ to the deflector-energization circuit 312. The central controller 36 also is configured, by appropriate software and by an internal memory, to process, store, and recall data regarding the position of the reticle subfield 15 to be illuminated by the illumination beam, and to produce a corresponding illumination-deflection command $C_i$.

The central controller 36 also is configured to output the projection-deflection command $C_p$ to the deflector-energization circuit 332. The central controller 36 also is configured, by appropriate software and internal memory, to process, store, and recall data regarding the position of the wafer subfield 23 to be exposed by the patterned beam, and to produce a corresponding projection-deflection command $C_p$.

The central controller 36 also is configured to output BSE data $D_e$ from the BSE detection circuit 352. The central controller 36 also is configured, by appropriate software, to determine the position of a fine-alignment mark 22 based on the BSE data $D_e$ stored in and recalled from the memory of the central controller 36. (The fine-alignment mark 22 is the area on the sensitive surface 20 to which the fine-alignment pattern 14 of the alignment subfield 17 is exposed.)

The central controller 36 also is configured to store and recall data pertaining to the circuit elements 16 of the reticle 1, as well as data pertaining to the fine-alignment pattern 14.

Figure 12:
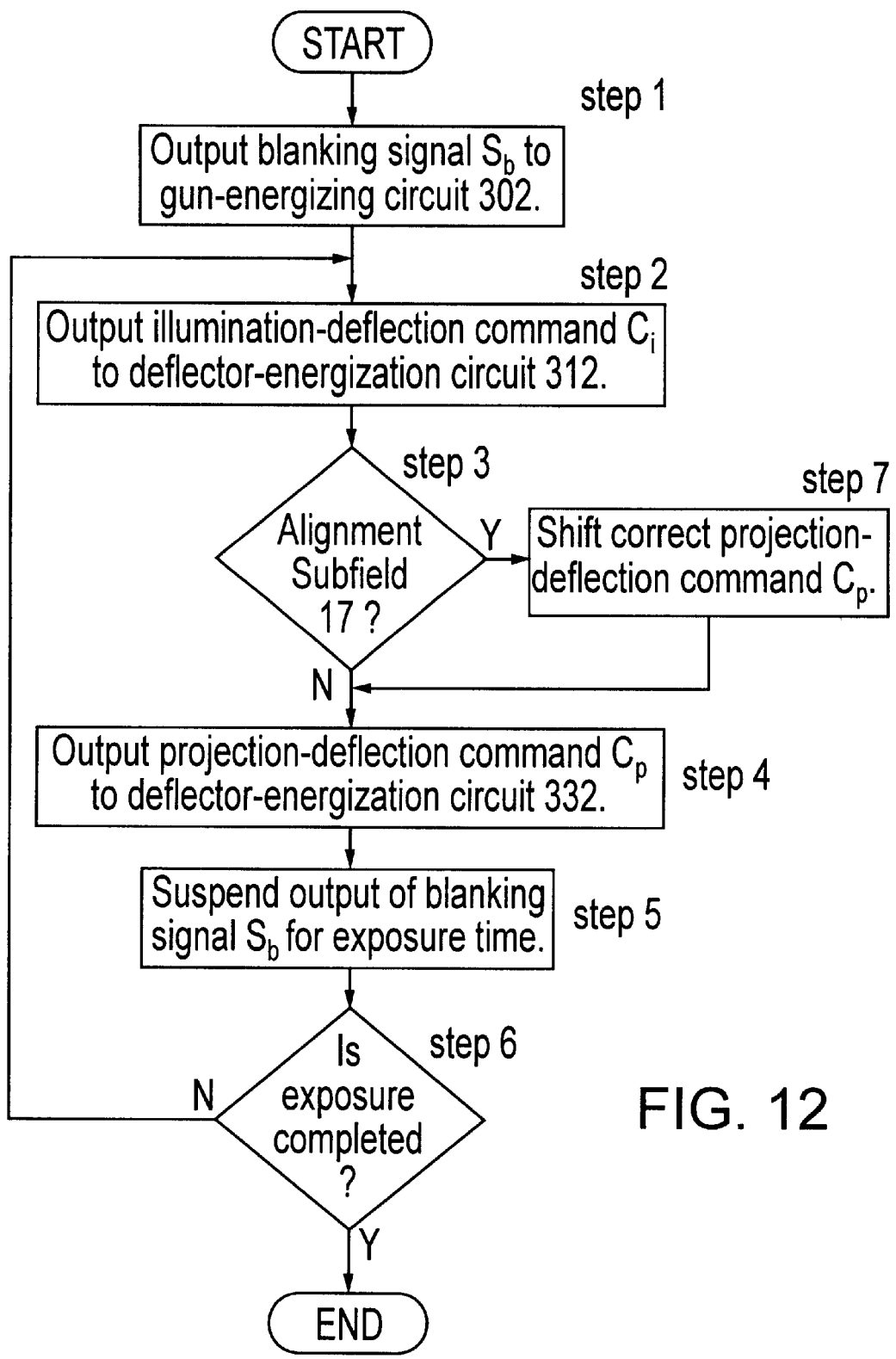
FIG. 12 is a flow chart of an example exposure operation executed by the central controller of the apparatus of FIG. 10.

The operation of the CPB microlithography apparatus 3 is now described with reference to FIGS. 11 and 12. FIG. 11 depicts representative locations on the sensitive surface 20 at which the reticle subfields 15 are exposed. FIG. 12 is a flow-chart of a representative exposure operation executed by the central controller 36. Operation of the CPB microlithography apparatus 3 includes a correction-computation operation and an exposure operation. The exposure operation normally is performed after execution of a correction-computation operation. First, an overview of the exposure operation is described. Then, the correction-computation operation and details of the exposure operation are described.

The exposure operation is outlined in FIG. 11, in which a depicted "circuit-exposure area" 24 is an area of the sensitive surface 20 of the wafer 2 in which the circuit-pattern area 12 of the reticle 1 is exposed. A "scribe-exposure area" 25 is an area of the sensitive surface 20 in which the scribe area 13 of the reticle 1 is exposed. The area sandwiched between the two dotted lines is a scribe line 21. A fine alignment mark 22 (corresponding to the fine-alignment pattern 14 on the reticle 1) fits completely within the scribe line 21. The cross-hatched regions are circuit elements 26 (corresponding to the circuit elements 16 on the reticle 1) as exposed onto the sensitive surface 20. An adjacent wafer subfield 27 corresponds to the adjacent reticle subfield 18 described above. The alignment wafer subfield 28 is the wafer subfield 23 to which the alignment subfield 17 on the reticle 1 is exposed.

The central controller 36 outputs the illumination command $C_i$ to the deflector-energization circuit 312, thereby stopping output of the blanking signal $S_b$ to the gun-energizing circuit 302. Whenever output of the blanking signal $S_b$ is stopped, the gun-energizing circuit 302 emits the illumination beam. The deflector-energization circuit 312 causes the illumination-deflector coil 311 to deflect the illumination beam to the selected reticle subfield 15 expressed by the illumination-deflection command $C_i$. Thus, the illumination beam illuminates the selected reticle subfield 15. As the illumination beam passes through the selected reticle subfield 15, the beam is "shaped" or "patterned" according to the elements of the pattern 10 disposed in the selected reticle subfield 15. The central controller 36 outputs a projection-deflection command $C_p$ to the deflector-energization circuit 332. According to the projection-deflection command $C_p$, the deflector-energization circuit 332 deflects the patterned beam toward the selected wafer subfield 23 expressed by the projection-deflection command $C_p$.

The central controller 36 causes exposure of the alignment wafer subfield 28 at a position separated in the Y-direction by a distance $\delta_s$ from the adjacent wafer subfield 27. During a correction-computation operation performed by the central controller 36, the distance $\delta_s$ is determined. The distance $\delta_s$ is determined based on data pertaining to the circuit elements 16 of the adjacent reticle subfield 18 and on data pertaining to the fine-alignment pattern 14 of the alignment subfield 17. The central controller 36 computes the position at which the circuit elements 16 of the adjacent reticle subfield 18 are to be exposed on the adjacent wafer subfield 27. The central controller 36 also computes the position at which the fine-alignment pattern 14 would be exposed if $\delta_s$ were equal to zero. The central controller 36 also computes an amount by which the circuit elements 26 of the adjacent wafer subfield 27 would be distorted due to a proximity effect imparted by the fine-alignment mark 22 on the circuit elements 26. The central controller 36 also computes a distance $\delta_d$ at which the amount of such distortion would be below a desired threshold value. (The desired threshold value is a value at which the amount of distortion is substantially zero.) The distance $\delta_d$ is the shortest distance between the circuit elements 26 of the adjacent subfield 27 and the fine-alignment mark 22 at which excessive distortion does not occur. The central controller 36 computes the distance $\delta_s$ based on the location of the circuit elements 26 of the adjacent subfield 27 and on the distance $\delta_d$.

Even if the central controller 36 does not determine the distance $\delta_s$ in the computation operation described above, the distance could be determined in advance using a computational apparatus separate from the CPB microlithography apparatus 3.

Certain aspects of an exposure operation are shown in FIG. 12. Whenever a reticle 1 is mounted to the reticle stage 32 and a wafer 2 is mounted in the wafer stage 34, the central controller 36 executes an exposure control according to the flow-chart shown in FIG. 12. In Step 1, the central controller 36 outputs a blanking signal $S_b$ to the gun-energizing circuit 302, causing the gun-energizing circuit 302 to turn off emission of the illumination beam by the electron gun 301.

After Step 1, the central controller 36 executes Step 2, in which the central controller 36 incorporates data regarding the position of the reticle subfield 15 to be illuminated into an illumination-deflection command $C_i$. The central controller 36 outputs the illumination-deflection command $C_i$ to the deflector-energization circuit 312. The deflector-energization circuit 312 generates a coil-energization signal $S_i$ based on the illumination-deflection command $C_i$, and outputs the coil-energization signal $S_i$ to the illumination-deflector coil 311. The illumination-deflector coil 311 generates an illumination-deflection field $H_i$ based on the coil-energization signal $S_i$.

After Step 2, the central controller 36 executes Step 3, in which the central controller 36 determines whether the reticle subfield 15 encoded in the illumination-deflection command $C_i$ in Step 2 is an alignment subfield 17. If the central controller 36 determines that the reticle subfield 15 is an alignment subfield 17, the central controller 36 proceeds to Step 4.

In Step 4, the central controller 36 encodes the position of the wafer subfield 23 to be exposed into a projection-deflection command $C_p$. The central controller 36 outputs the projection-deflection command $C_p$ to the deflector-energization circuit 332. The deflector-energization circuit 332 generates a coil-energization signal $S_p$ based on the projection-deflection command $C_p$, then outputs the coil-energization signal $S_p$ to the deflector coil 331. The deflector coil 331 generates a projection-deflection field $H_p$ based on the coil-energization signal $S_p$.

After Step 4, the central controller 36 executes Step 5, in which the central controller 36 suspends output of the blanking signal $S_b$ to the gun-energizing circuit 302 for a predetermined exposure time. Whenever the gun-energizing circuit 302 suspends output of the blanking signal $S_b$, the electron gun 301 emits the illumination beam. The illumination beam emitted by the electron gun 301 is deflected by the illumination-deflection field $H_i$ and illuminates the reticle subfield 15 encoded in the illumination-deflection command $C_i$.

As the illumination beam passes through the selected reticle subfield 15, the beam is "shaped" or "patterned" according to the pattern 10 in the selected reticle subfield 15. The resulting patterned beam is deflected by the projection-deflection field $H_p$ so as to expose the corresponding wafer subfield 23 encoded in the projection-deflection command $C_p$.

After Step 5, the central controller 36 executes Step 6, in which the central controller 36 determines whether exposure of all the wafer subfields 23 has been completed. If the central controller 36 determines that exposure of all the wafer subfields 23 has not been completed, the controller returns to Step 2 so as to repeat execution of Steps 2 through 6.

In Step 3, if the central controller 36 determines that the reticle subfield 15, encoded in the illumination-deflection command $C_i$ in Step 2, is an alignment subfield 17, the controller executes Step 7 after Step 3. In Step 7, the central controller 36 corrects data, concerning the position of the alignment wafer subfield 28 to be exposed, by the distance $\delta_s$. The operation of adding the distance correction $\delta_s$ to the data concerning the position of the alignment wafer subfield 28 is termed "shift correction." The central controller 36 incorporates the shift-corrected data concerning the position of the alignment wafer subfield 28 into the projection-deflection command $C_p$. The central controller 36 outputs the shift-corrected projection-deflection command $C_p$ to the deflector-energization circuit 332.

The deflector-energization circuit 332 generates a shift-corrected coil-energization signal $S_p$ based on the shift-corrected projection-deflection command $C_p$, and then outputs the shift-corrected coil-energization signal $S_p$ to the projection-deflector coil 331. The projection-deflector coil 331 generates a shift-corrected projection-deflection field $H_p$ based on the shift-corrected coil-energization signal $S_p$.

Figure 5A:
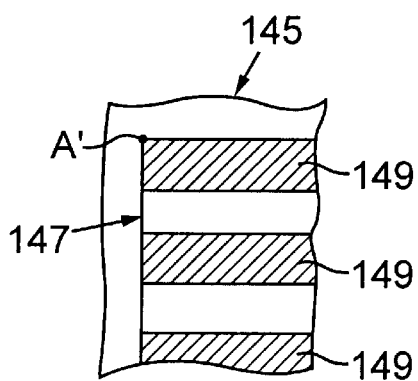
FIGS. 5(a)–5(b) are schematic plan views of regions on a conventional patterning reticle and corrective ("ghosting") reticle, respectively, as used in a conventional ghosting method to produce the wafers shown in FIGS. 4(a)–4(c). Both figures show a region in the vicinity of a point "A" that corresponds to the point "A" in FIGS. 4(a)–4(c).
Figure 5B:
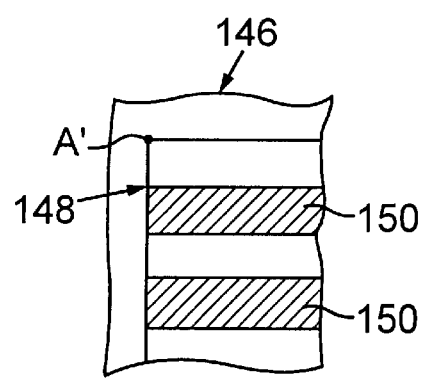

After Step 7, the central controller 36 executes Steps 4 and 5, during which the alignment wafer subfield 28 is exposed at a position separated by the distance $\delta_s$ in the Y-direction from the adjacent wafer subfield 27, as shown in FIG. 5. Whenever the alignment wafer subfield 28 is exposed at a position separated by the distance $\delta_s$ in the Y-direction from the adjacent wafer subfield 27, the fine-alignment mark 22 is exposed at a position separated by the distance $\delta_d$ from the circuit elements 26. Such exposure maintains any amount of distortion imparted by the fine-alignment mark 22 on a circuit element 26 due to the proximity effect below a specified threshold value.

Thus, the CPB microlithography apparatus 3 advantageously exposes the adjacent wafer subfield 27 with a sub-threshold level of distortion imparted by the fine-alignment mark 22 on the circuit elements 16 in the adjacent reticle subfield 18 due to the proximity effect. Also, since the fine-alignment mark 22 is smaller than the size of the scribe line 21, the fine-alignment mark 22 is still exposed at a position within the scribe line 21.

A circuit element 16 is not disposed in the alignment subfield 17 of the reticle 1. Consequently, even though the alignment wafer subfield 28 is exposed at a position separated by the distance $\delta_s$ from the adjacent wafer subfield 27, no circuit element 16 has a shifted exposure position.

In Step 6, if the central controller 36 determines that exposure of all the wafer subfields 23 has been completed, the controller ends the exposure operation.

Representative Embodiment 2

A reticle 4 according to this embodiment is identical to the reticle 1 in Representative Embodiment 1. Hence, except for an alignment subfield 40 of the reticle 4, other description of the reticle 4 is omitted. In this embodiment, all components that are similar to respective components in Representative Embodiment 1 have the same reference numerals.

Figure 13:
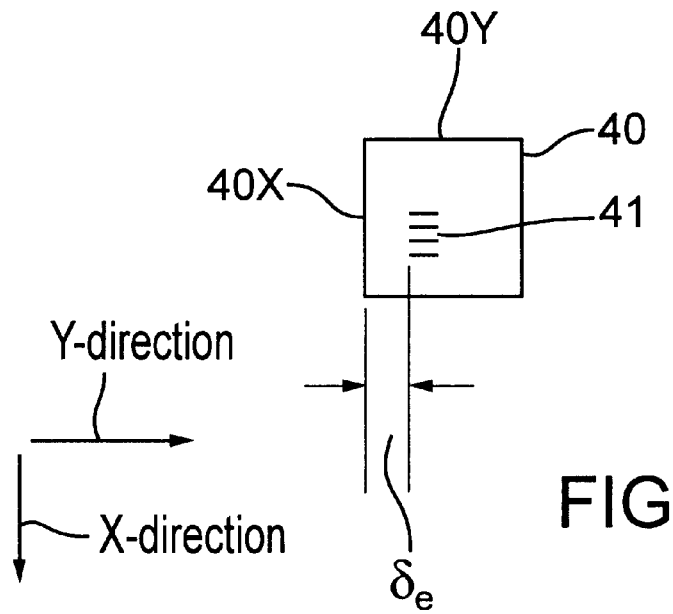
FIG. 13 is a schematic plan view of an alignment subfield of a reticle according to Representative Embodiment 2.
Figure 14:
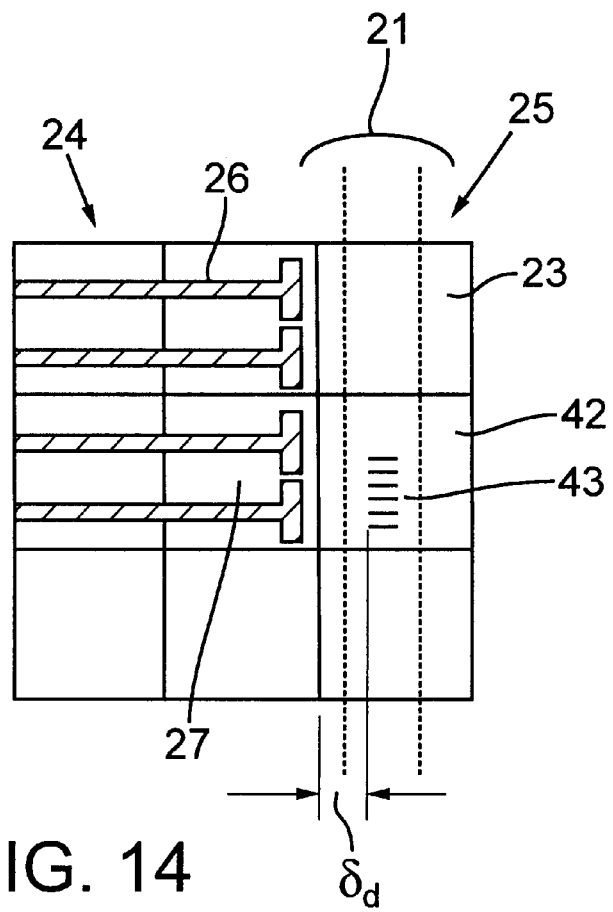
FIG. 14 is a schematic plan view of a portion of a wafer exposed using the reticle of FIG. 13.

The alignment subfield 40 of the reticle 4 is described in connection with FIGS. 13–14, in which FIG. 13 depicts the alignment subfield 40, and FIG. 14 depicts a relevant portion of the sensitive surface 20 of the wafer 2. The alignment subfield 40 is identical to the alignment subfield 17 of Representative Embodiment 1, except that the position at which a fine-alignment pattern 41 of the alignment subfield 40 is disposed is different from the position of the fine-alignment pattern 14 of Representative Embodiment 1.

As shown in FIG. 13, the fine-alignment pattern 41 is disposed at a position separated from a side 40X by a distance $\delta_e$. The side 40X is the side, of the four sides of the fine-alignment pattern 41, that is parallel with the X-direction and near the adjacent reticle subfield 18. The distance $\delta_e$ is equal to the distance $\delta_d$ times the reciprocal of the demagnification factor by which images of the reticle 4 are demagnified during exposure. The distance $\delta_e$ is the shortest distance between the fine-alignment pattern 41 and the circuit elements 16 in the adjacent reticle subfield 18.

The adjacent reticle subfield 18 is exposed to a corresponding adjacent wafer subfield 27. The alignment subfield 40 is exposed to a corresponding alignment wafer subfield 42. The corresponding location on the wafer 2 to which the fine-alignment pattern 41 is exposed is a fine-alignment mark 43. Since the fine-alignment pattern 41 is separated from the side 40X by the distance $\delta_e$, the fine-alignment mark 43 is exposed onto a corresponding location on the wafer that is separated by the distance $\delta_d$ from the circuit elements 26 of the adjacent wafer subfield 27, as shown in FIG. 14. Consequently, the amount of distortion imparted by the fine-alignment mark 43 to the circuit element 26 due to the proximity effect is below a specified threshold value.

The reticle of this embodiment can be used in combination with a CPB microlithography apparatus 5 as described below. The CPB microlithography apparatus 5 is identical to the apparatus 3 described in Representative Embodiment 1, except that the apparatus 5 has a different central controller 50. Hence, with respect to the apparatus 5, only the central controller 50 is described.

Figure 15:
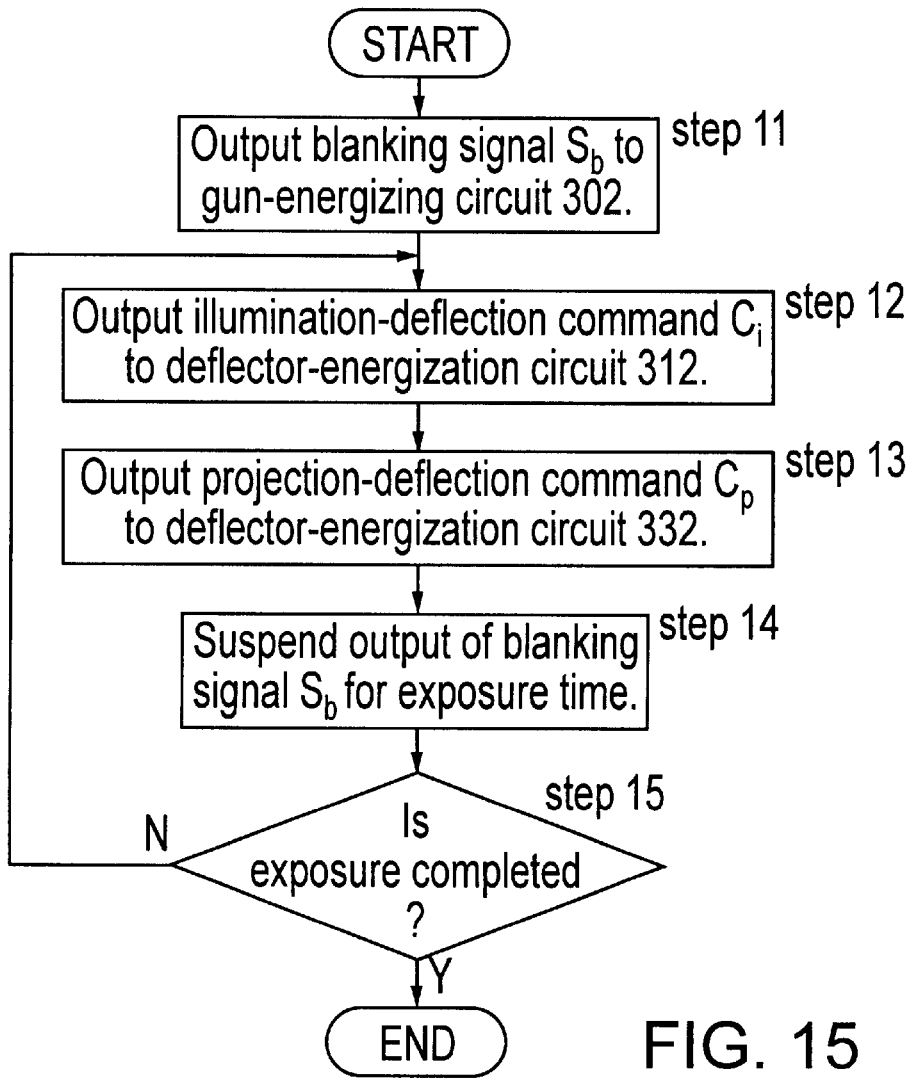
FIG. 15 is a flow chart of an exposure method as described in Representative Embodiment 2.

The central controller 50 controls the CPB source 30, illumination deflector 31, projection deflector 33, and BSE detector 35 according to the flow-chart shown in FIG. 15. The flow-chart of FIG. 15 is identical to the flow-chart of FIG. 12, except that Step 4 in the flow-chart of FIG. 12 is executed following Step 2 in the flow-chart of FIG. 5. In other words, in the flow-chart of FIG. 15, Step 11 has the same function as Step 1 of FIG. 12; Step 12 has the same function as Step 2 of FIG. 12, Step 13 has the same function as Step 4 of FIG. 12, Step 14 has the same function as Step 5 of FIG. 12, and Step 15 has the same function as Step 6 of FIG. 12. Consequently, an explanation of the flow-chart of FIG. 15 is omitted.

When the central controller 50 executes the flow-chart shown in FIG. 15, the fine-alignment mark 43 is exposed to a position (on the wafer 2) separated by the distance $\delta_d$ from the circuit elements 26 of the adjacent wafer subfield 27, as shown in FIG. 14. By exposing the fine-alignment mark 43 in such a manner, the level of distortion imparted by the fine-alignment mark 43 on the circuit elements 26 due to the proximity effect is below a specified threshold value.

Representative Embodiment 3

A reticle 6 according to this embodiment is identical to the reticle 1 described in Representative Embodiment 1. Hence, except for an adjacent reticle subfield 60 of the reticle 6, all other description of the reticle 6 is omitted. All components in this embodiment that are similar to respective components in Representative Embodiment 1 have the same reference numerals and are not described further.

The adjacent reticle subfield 60 is a reticle subfield 15 that is disposed in the circuit-pattern area 12. The adjacent reticle subfield 60 is disposed at a position adjacent the alignment subfield 17 of the reticle 6.

Figure 16:
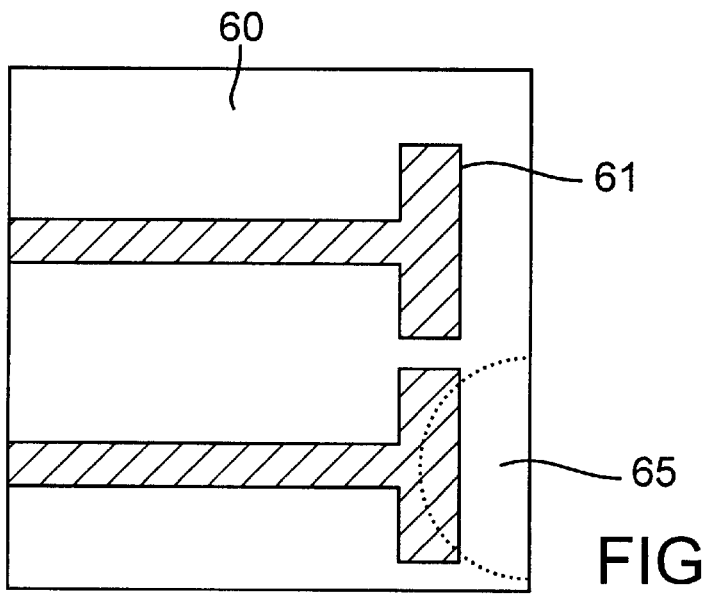
FIG. 16 is a schematic plan view of a subfield of a reticle according to Representative Embodiment 3.

Certain aspects of the adjacent reticle subfield 60 of the reticle 6 are depicted in FIG. 16. As denoted by the cross-hatched area in FIG. 16, multiple circuit elements 61 are disposed in the adjacent reticle subfield 60. Reshaping correction is applied to these circuit elements 61 so that the level of distortion imparted on respective circuit elements 62 (as exposed on the sensitive surface 20 of the wafer) by the proximity effect is below a specified threshold value. "Reshaping correction" is a correction that fixes the shapes of the elements 61 on the reticle 6.

Meanwhile, there is an area in the adjacent wafer subfield 63 in which the magnitude of the proximity effect imparted on the adjacent wafer subfield 63 by the fine-alignment mark 22 exceeds a specified threshold value. This area is called a "weighted field" 64. The adjacent wafer subfield 63 is the area on the sensitive surface 20 to which the adjacent reticle subfield 60 is exposed. Distortion caused by the proximity effect between circuit elements 62 and distortion caused by the proximity effect imparted by the fine-alignment mark 22 accumulate in the circuit element 62 in the weighted field 64.

Therefore, in addition to a reshaping correction to correct the proximity effect between circuit elements 62, reshaping correction to correct the proximity effect imparted by the fine-alignment mark 22 on the adjacent wafer subfield 63 is further implemented on the field at the position at which the weighted field 64 is exposed in the adjacent reticle subfield 60. The field at the position at which the weighted field 64 is exposed is called the "intensified correction area" 65.

Since both types of reshaping correction are implemented in the intensified correction area 65, the level of distortion in the circuit elements in the weighted field 64 due to the proximity effect is below a specified threshold value.

The reticle 6 can be used with a CPB microlithography apparatus having the same function as the CPB microlithography apparatus 5 in Representative Embodiment 2.

Corrections of the proximity effect implemented in the intensified correction area 65 may be realized not only by reshaping correction of the circuit feature 61, but also by "ghosting" or by "dose compensation."

Representative Embodiment 4

Figure 17A:
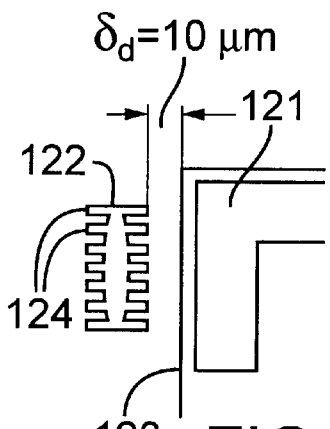
FIGS. 17(a)–17(c) are schematic plan views of a region of a wafer exposed as described in Representative Embodiment 4, involving placing an alignment mark a particular distance $\delta_d$ from a chip boundary, wherein the distance $\delta_d$ is a function of the beam-acceleration voltage.
Figure 17B:
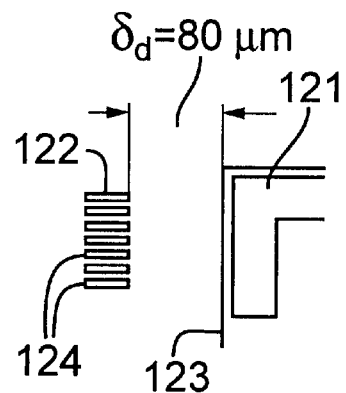
Figure 17C:
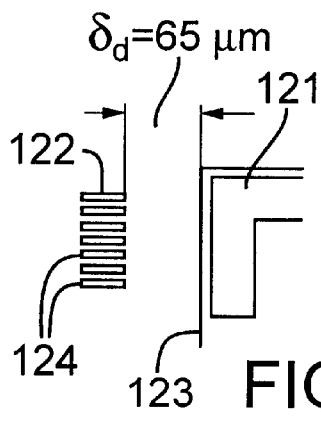

Aspects of this embodiment are depicted in FIGS. 17(a)–17(c). FIG. 17(a) depicts the results of forming, by projection-exposure, an alignment mark 122 (intended to comprise multiple individual elements 124) outside a chip boundary 123. Adjacent the chip boundary 123 within the chip is a pattern element 121. In FIG. 17(a), by way of example, the beam-acceleration voltage is 100 KV and the distance $\delta_d$ between the alignment mark 122 and the chip boundary 123 is 10 $\mu$m. Under such conditions, a proximity effect imparted by the element 21 on the alignment mark 22 results in the elements 124 of the mark, as exposed on the wafer, becoming undesirably fused together as shown.

Referring to FIGS. 17(b) and 17(c), at a beam-acceleration voltage of 100 KV, if $\delta_d$=80 $\mu$m or 65 $\mu$m, respectively, then adverse results from the proximity effect of the pattern element 121 on the alignment mark 122 are eliminated. Thus, the mutual results of the proximity effect of the alignment mark 122 and the pattern element 121 with each other are eliminated by forming the alignment mark 122 at least a certain threshold distance from the pattern element 121.

Representative Embodiment 5

In this embodiment, the circuit pattern and peripheral alignment marks are regarded as respective portions of the entire pattern to be formed on the wafer, and correction of proximity effects can be performed by any of several techniques. As a first example, pattern features are reshaped before exposure so as to correct proximity effects during exposure, taking into consideration the energy accumulation in the resist from electrons backscattered from the adjacent alignment mark. As a second example, features of the alignment mark are reshaped before exposure so as to correct proximity effects during exposure, taking into consideration the energy accumulation in the resist from electrons backscattered from adjacent elements of the chip pattern. In both instances, either the alignment mark or the chip pattern can be exposed first, or both can be exposed simultaneously.

Alternatively, proximity effects of the alignment mark and adjacent pattern features are corrected by controlling the irradiation dose. As a first example, the radiation dose applied when exposing the chip pattern is changed before beginning exposure, wherein the change is made with consideration given to the energy accumulation in the resist from electrons backscattered from the alignment mark. As a second example, the radiation dose applied when exposing the alignment mark is changed before beginning exposure, wherein the change is made with consideration given to the energy accumulation in the resist from electrons backscattered from elements of the chip pattern. In both instances, either the alignment mark or the chip pattern can be exposed first or both can be exposed simultaneously.

Further alternatively, proximity-effect correction is performed by "ghosting." In this technique, for example, a first exposure of the wafer is made using a patterned beam that has passed through a reticle defining the chip pattern and the alignment mark(s). A second, and subsequent, exposure of the wafer is made using a "correcting" beam carrying an inverted GHOST pattern. The area of the wafer irradiated with the correcting beam extends beyond the chip field to include the adjacent alignment mark(s), taking into consideration the energy accumulation in the resist from electrons backscattered from the various elements of the pattern.

Figure 18A:
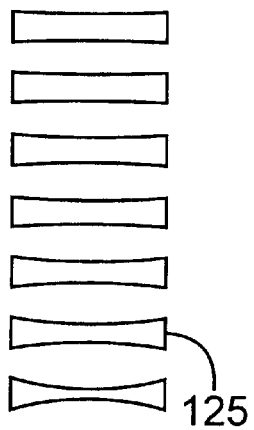
FIGS. 18(a)–18(b) are schematic plan views of a region of a reticle and corresponding region of a wafer, respectively, as described in Representative Embodiment 5, involving reshaping an alignment mark to reduce proximity effects.
Figure 18B:
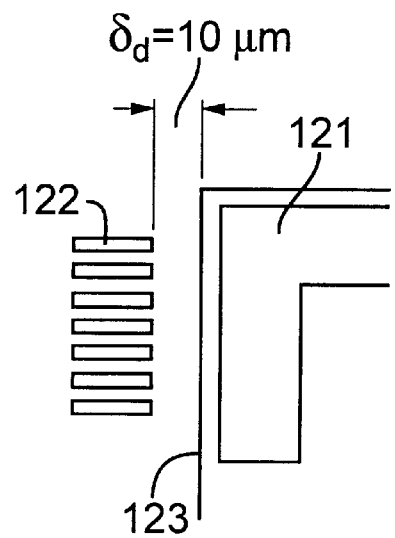

By way of example, FIG. 18(a) shows a representative reshaped alignment-mark pattern 125 as defined on a reticle at a specified location near the chip pattern. After being exposed onto the wafer by a beam subjected to a 100 KV acceleration voltage, the desired alignment-mark configuration was obtained even with the alignment mark situated no more than $\delta_d=10$ μm from the edge of the chip field, as shown in FIG. 18(b).

Representative Embodiment 6

Figure 19:
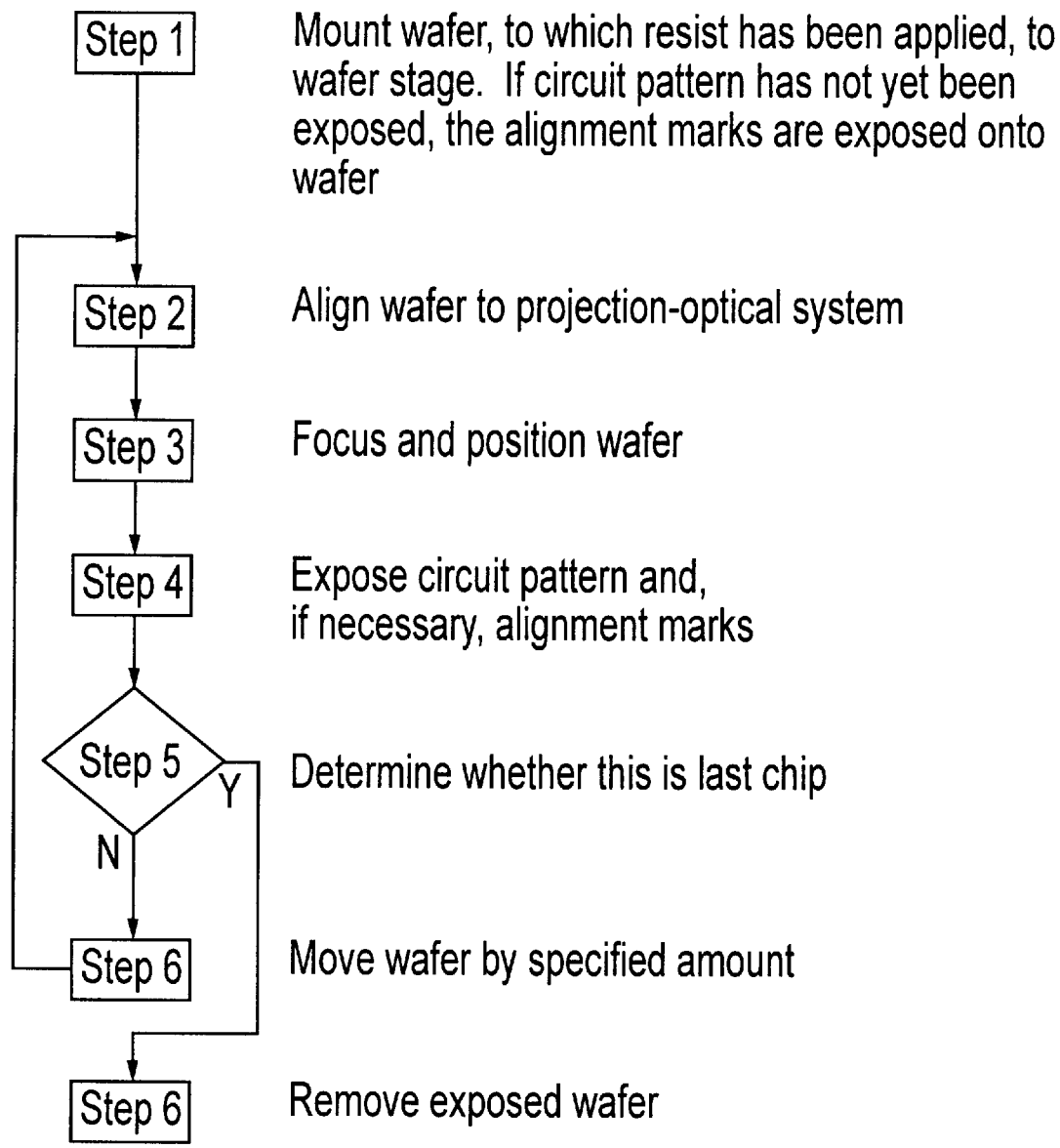
FIG. 19 is a flow-chart of a wafer-processing method as described in Representative Embodiment 6.

A process according to this embodiment is outlined in FIG. 19. In Step 1, a wafer to which a resist has been applied is mounted on a movable wafer stage. In Step 2, the wafer is aligned with the projection-optical system of the CPB microlithography apparatus. In Step 3, the projection-optical system is focused on the wafer, and wafer positioning is performed. In Step 4, a circuit pattern and alignment mark(s) are exposed onto the wafer. In Step 5, a determination is made as to whether the just-exposed chip is the last chip to be exposed on the wafer or whether more chips are to be exposed onto the wafer. If more chips are to be exposed, in Step 6, the wafer is moved a specified amount and the process returns to Step 2. If the just-exposed chip is the last one to be exposed onto the wafer, then in Step 7 the wafer is removed.

Step 4 can be performed according to any of Representative Embodiments 4–5.

Representative Embodiment 7

Figure 20:
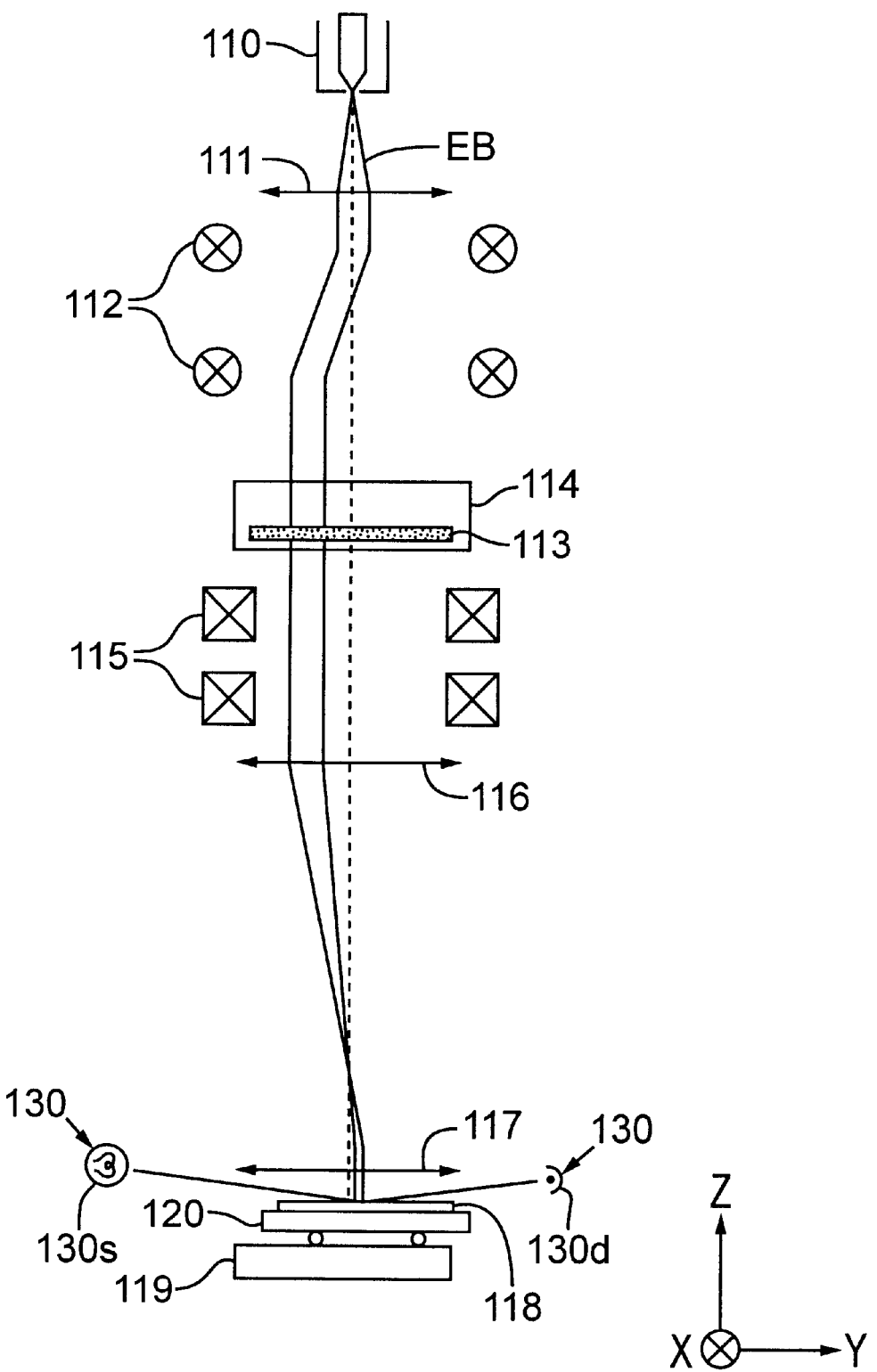
FIG. 20 is an elevational schematic diagram of a CPB microlithography apparatus as described in Representative Embodiment 7.

This embodiment is directed to an exemplary CPB microlithography apparatus utilizing an electron beam as an energy beam, and with which proximity-effect corrections as described elsewhere herein can be performed. This embodiment is depicted in FIG. 20. An electron beam EB is emitted from an electron gun 110 and collimated by a condenser lens 111. The beam EB is deflected laterally in the X-Y plane as required by a subfield-selection deflector 112 so as to illuminate a selected subfield of the reticle 113. The beam EB propagating between the electron gun 110 and the reticle 113 is termed the "illumination beam," and the electron-optical components (e.g., lens 111 and deflector 112) between the electron gun 110 and reticle 113 collectively are termed the "illumination-optical system." The reticle 113 is mounted to a reticle stage 114.

Portions of the illumination beam passing through the reticle 113 become, by such passage, a "patterned beam" that propagates to the wafer 118. The patterned beam is deflected by a deflector 115 and shaped by projection lenses 116, 117 to form an image of the illuminated reticle subfield at a specified location on the wafer 118. The image as formed on the wafer by the projection lenses 116, 117 is at a specified "reduction ratio" (demagnification ratio, e.g., 1/4). The electron-optical components (e.g., deflector 115 and lenses 116, 117) situated between the reticle 113 and wafer 118 are termed collectively the "projection-optical system."

The wafer 118 is "sensitized" with a surficial layer of a suitable resist.

The wafer 118 is also located in an X-Y plane parallel to the reticle 113, and is mounted on a wafer stage 120 that is movable relative to a stage base 119. In FIG. 20, the X-axis extends in a direction perpendicular to the plane of the page.

This embodiment can be used to perform the process discussed above in Representative Embodiment 6. In Step 1, the wafer 118 is coated with the resist at a resist-coating station (not shown) and transported to the wafer stage 120 by a transport apparatus (not shown, but known in the art). In Step 2, the reticle stage 114 is aligned with the projection-optical system by an interferometer-based measurement apparatus (not shown, but known in the art). In Step 3, the projection-optical system is focused by moving the wafer 118 in the Z-direction. During exposure, energization parameters of the projection lenses 116, 117 are adjusted and set according to the output of a focus detector 130 comprising a light source 130s and a sensor 130d. In Step 4, the circuit pattern as defined on the reticle 113 is exposed onto the wafer at a specified position that has been aligned three-dimensionally to the projection-optical system. At this time, if it is necessary to form an alignment mark adjacent the boundary of the chip field, the alignment mark is also formed on the wafer 118.

An alignment mark must be formed on the wafer at least when exposing the first-layer circuit pattern. In Step 2, the wafer 118 is aligned with the projection-optical system using that alignment mark.

In Step 5, a control device (not shown) determines whether the present chip being formed on the wafer 118 is the last to be exposed onto the wafer. If so, then exposure of the wafer is completed and the wafer is removed in Step 7 from the wafer stage 120 by a wafer-transport device (not shown, but known in the art). If more chips are to be exposed onto the wafer 118, then in Step 6 the wafer 118 is moved a specified distance and the process returns to Step 2.

In the above-described method performed using the embodiment of FIG. 20, in Step 4 the alignment mark and adjacent circuit pattern can be formed on the wafer 118 at a desired accuracy using any of the techniques described in the other representative embodiments.

Representative Embodiment 8

Figure 1:
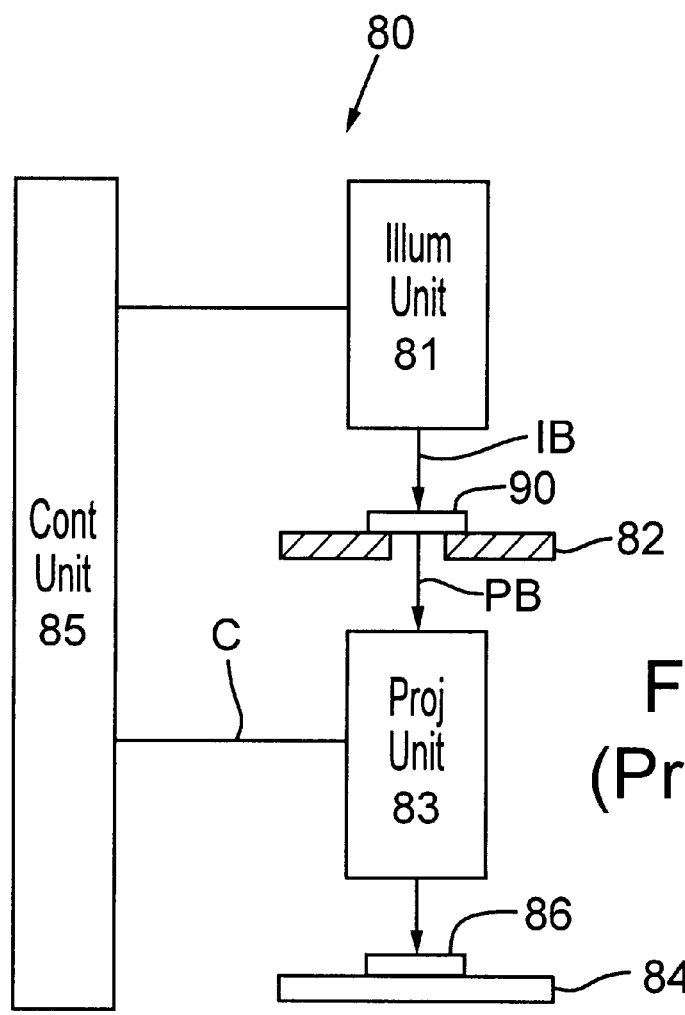
FIG. 1 is a functional block diagram of a conventional charged-particle-beam (CPB) microlithography apparatus.
Figure 2:
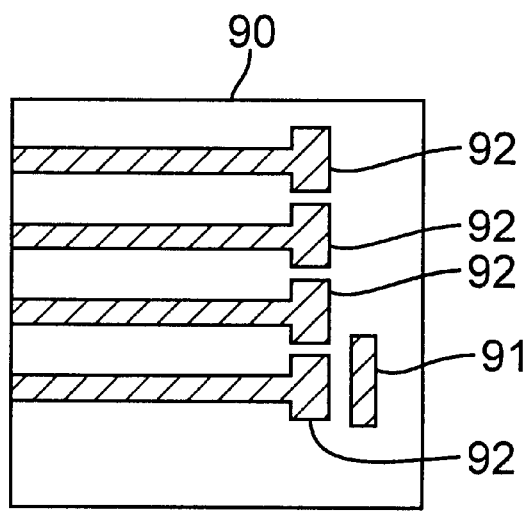
FIG. 2 is a schematic plan view of a portion of a conventional reticle.
Figure 3A:
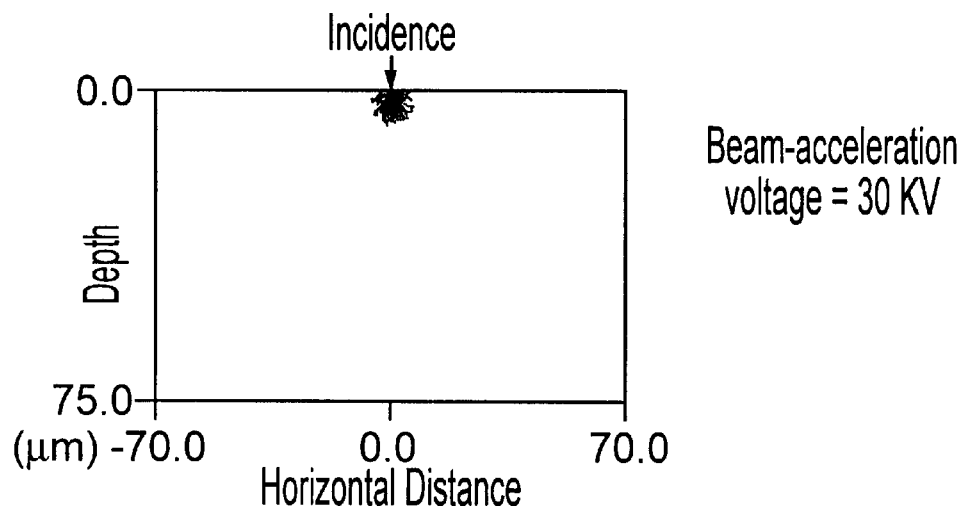
FIGS. 3(a)–3(b) are Monte Carlo simulations of electron scatter in a resist, as obtained with an electron beam subjected to a beam-acceleration voltage of 30 KV and 100 KV, respectively.

This embodiment utilizes a CPB microlithography apparatus as described above in Representative Embodiment 7 and shown in FIG. 20, and has certain similarities to the GHOST technique, in which a "corrective" exposure of the wafer is made in addition to the actual pattern exposure. During the corrective exposure, the electron beam EB (as an exemplary charged particle beam) is set to provide a lower exposure dose to the resist than during actual pattern exposure. Also, during the corrective exposure, the beam is defocused by an amount corresponding to the horizontal spread of incident electrons being scattered as they enter the resist (see FIGS. 3(a)–3(b)). Although not intending to be limiting in any way, the wafer in this embodiment is silicon, to which a negative resist is applied. Alternatively, the resist can be a positive resist.

Figure 21A:
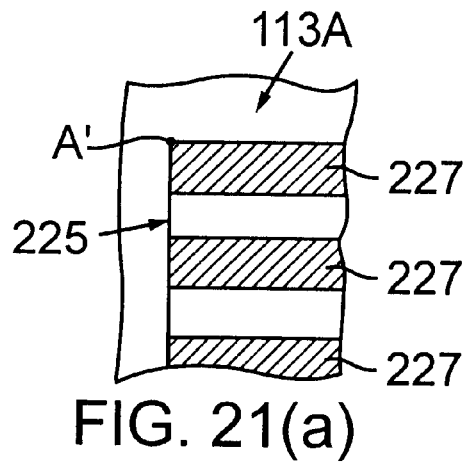
FIGS. 21(a)–21(b) are schematic plan views of regions of a patterning reticle and corrective reticle, respectively, according to Representative Embodiment 8.
Figure 21B:
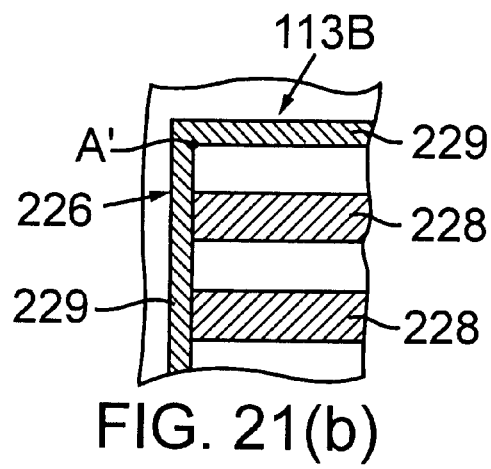
Figure 22A:
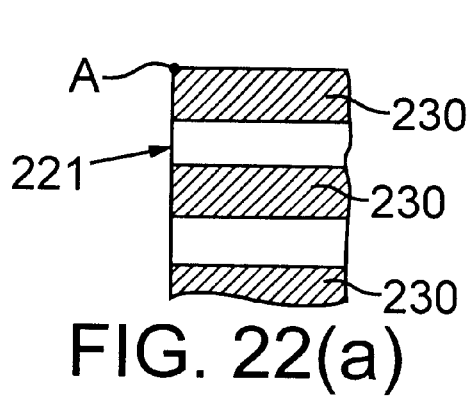
FIGS. 22(a)–22(c) are schematic plan views of regions on a wafer exposed as described in Representative Embodiment 8.
Figure 22B:
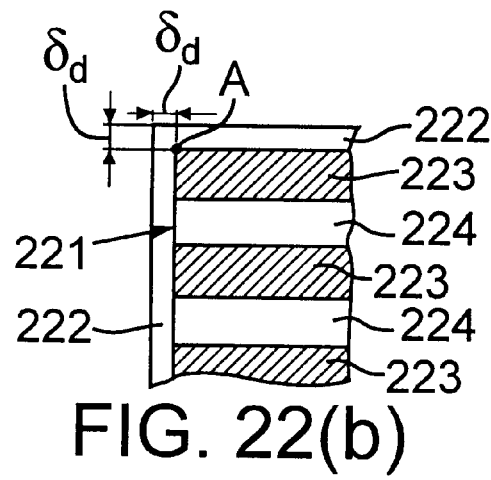
Figure 22C:
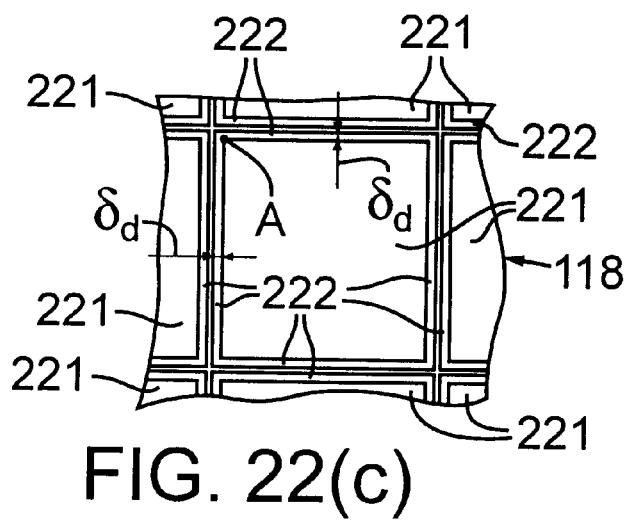

Correction of proximity effects in this embodiment is performed using a patterning reticle as shown in FIG. 21(a) and a corrective reticle as shown in FIG. 21(b). FIGS. 22(a)–22(c) schematically depict exposure fields on the wafer 118 and representative patterns formed therein. FIG. 22(a) is a plan view of a portion of the substrate occupied by a single chip, FIG. 22(b) details the vicinity of point A in FIG. 22(a), and FIG. 22(c) details the vicinity of point A as it appears after development processing. FIG. 21(a) is a plan view showing certain aspects of the patterning reticle, and FIG. 21(b) is a plan view showing certain aspects of the corrective (ghosting) reticle.

Figure 3B:
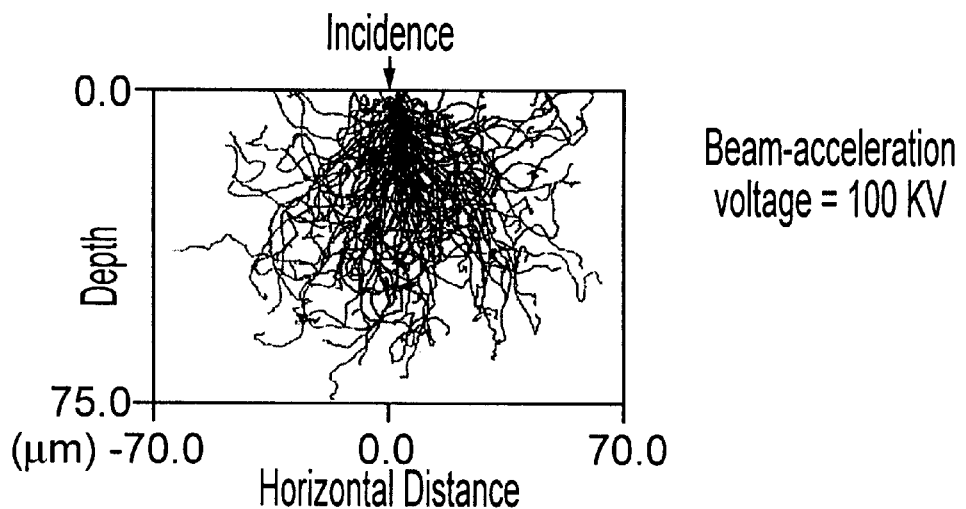
Figure 4A:
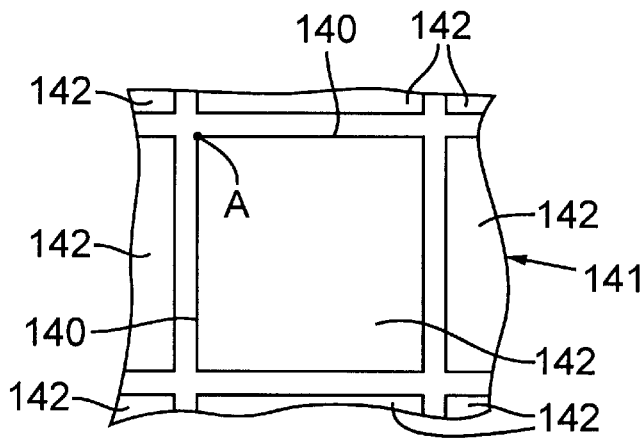
FIGS. 4(a)–4(c) are schematic plan views of regions on a sensitive substrate ("wafer") as exposed using a conventional ghosting technique.
Figure 4B:
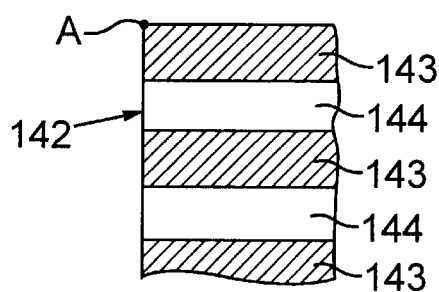
Figure 4C:
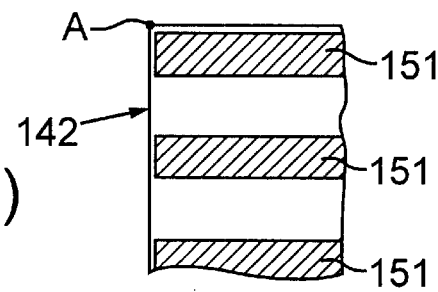

Turning first to FIGS. 22(a) and 22(b), the regions 221 are chip fields on the wafer 118, and the regions 222 are perimeter zones residing outside the boundaries of the chip fields 221. In this embodiment, actual pattern exposure is performed within the confines of each chip field 221. However, in contrast with conventional ghosting as described above in connection with FIGS. 4(a)–4(c) and 5(a)–5(b), corrective exposure is not limited to the confines of the chip fields 221. Rather, corrective exposure also is made in the perimeter zones 222 surrounding each respective chip field 221. In other words, during each corrective exposure, the perimeter zones 22 are exposed in addition to the respect chip fields 221. Each perimeter zone 222 has a width $\delta_d$ that is a function of the acceleration voltage of the electron beam used for pattern exposure. Preferably, the width $\delta_d$ is sufficient to increase the horizontal component of the distance traversed by a scattered electron in the resist on the wafer 118. For example, if the simulated electron-scatter trace diagram for a resist on a wafer 118 is as shown in FIG. 3(b), obtained with a beam-acceleration voltage of 100 KV, then the width $\delta_d$ of the perimeter zone 222 desirably is greater than 65 $\mu$m. Thus, the chip fields 221 are arrayed in two dimensions (X- and Y-dimensions) on the wafer 118, with specified gaps between the chip fields. The location of each chip field 221 on the wafer 118 is determined by the measured position of the movable wafer stage 120 and magnitude and direction of deflection imparted to the patterned beam by the deflector 115.

Detail in the vicinity of point A (upper left corner of the chip field 221) in FIG. 22(a) is shown in FIG. 22(b). Regions 223 in FIG. 22(b) are pattern-exposure regions inside the chip field 221 that are exposed by the patterned beam, but are not exposed during corrective exposure. Regions 224 in FIG. 22(b) are not exposed by the patterned beam, but are exposed during corrective exposure. As noted above, the perimeter zone 222 is also a corrective exposure region.

To expose the wafer, a "patterning" reticle 113A such as the reticle of FIG. 21(a) is used to expose the chip pattern, and a "corrective" reticle 113B such as the reticle of FIG. 21(b) is used for proximity-effect correction (ghosting). As is well known in CPB microlithography, a reticle normally is "divided" or "segmented" into multiple "subfields" (not shown) arranged in a regular array in the X- and Y-directions. The reticle subfields are exposed onto corresponding regions in each chip field 221 on the wafer. Thus, although not shown, it will be understood that the patterning reticle 113A (including chip field and perimeter zones) is divided into multiple subfields. Similarly, the corrective reticle 113B is divided into multiple subfields corresponding to 15 the subfields on the patterning reticle 113A. On the corrective reticle 113B, since the subfields located adjacent boundary regions of the chip field 221 also include respective portions of the peripheral zone 222, there is a difference, albeit slight, in the subfields arrayed along the perimeter zone 222 between the sub-fields on the wafer 118 that correspond to the subfields on the patterning reticle 113A and the subfields on the wafer 118 that correspond to the subfields on the corrective reticle 113B.

The point A' in FIGS. 21(a) and 21(b) corresponds with the point A in FIGS. 22(a)–22(c). The patterns in the various subfields of the reticles 113A and 113B are left-to-right inverted. However, with respect to FIGS. 21(a) and 21(b), they are not shown or described as inverted in order to simplify the explanation. Furthermore, only a portion of one subfield 225 on the patterning reticle 113A (corresponding to the subfield in the upper-left corner in the figure that includes point A' on the wafer 118) is shown in FIG. 21(a). Furthermore, only a portion of one of the subfields 226 on the corrective reticle 113B that corresponds to the subfield in the upper-left corner in the figure that includes point A' on the wafer 118 is shown in FIG. 21(b). As can be seen in FIGS. 21(a)–21(b), the subfield on the wafer 118 that corresponds with the subfield 225 on the reticle 113A does not match the subfield on the wafer 118 that corresponds with the subfield 226 on the reticle 113B.

Although not shown, the reticles 113A and 113B include scattering bodies exhibiting a large electron-scattering angle. The scattering bodies reside in areas corresponding with elements of the patterns to be transferred. The scattering bodies are formed on a thin film that has a high transmissivity to electrons. In FIG. 21(a), regions 227 are areas in which a respective scattering body is not present, while intervening regions are areas in which a respective scattering body is present.

The pattern-exposure regions 223 in FIG. 22(b) are projection exposed (with demagnification) using the electron beam that has passed through the regions 227. Likewise, in FIG. 21(b), the regions 228 and 229 are areas in which a respective scattering body is absent, while respective scattering bodies are present in the intervening areas. The exposure regions 224 and the perimeter zone 222 in FIG. 22(b) are exposed by projection-exposure (with demagnification) by a beam that has passed through the respective region 228, 229.

The regions 228, 229 on the reticle 113B correspond respectively with the peripheral zone 222 and exposure regions 224 on the wafer 118. The region 229 is an area that corresponds with the perimeter zone 222 on the wafer 118 and is an area that transmits the corrective beam to pass readily to the wafer 118.

As an alternative to using reticles in which pattern elements are defined using regions occupied by respective scattering bodies, the reticles 113A, 113B can be "stencil" reticles in which elements are defined by corresponding voids in an CPB-blocking reticle membrane.

For exposure, the patterning reticle 113A and the corrective reticle 113B are "swapped" using a reticle loader (not shown) and placed in a specified exposure position for both patterning exposure and corrective exposure.

It will be understood that the patterning reticle and corrective reticle need not be separate reticles. Rather, it is possible to form the various subfields of the patterning reticle 113A and the various subfields of the corrective reticle 113B on the same reticle.

Using an apparatus as shown in FIG. 20, the corrective exposure regions 224 and the perimeter zone 222 (FIG. 22(b)) are exposed with a corrective electron beam (having an irradiation dose smaller than the irradiation dose of the patterning beam), using the reticle 113B, before or after exposing the pattern-exposure regions 223 in FIG. 22(b) with the patterning beam using the reticle 113A.

In correcting proximity effects according to this embodiment, since the corrective fields in FIG. 22(b) are exposed using a corrective beam, the proximity effect resulting from irradiating the patterning beam onto the wafer 118 can be corrected by ghosting. However, in contrast to conventional correction of proximity effects by ghosting, the corrective beam irradiates not only the corrective exposure fields inside the chip field 221 on the wafer 118 but also the perimeter zones 222 outside the chip field 221. As a result, proximity effects can be corrected and energy accumulations in the resist on the wafer 118 can be made more uniform over the wafer 118, even when the beam-acceleration voltage of the patterning beam is high and even at the perimeter of each chip field 221. Hence, when the exposed wafer 118 is developed, as in FIG. 22(b), substantially no narrowing or widening is experienced beyond the desired rendered pattern elements, even for elements 230 that extend to the perimeter of the chip field 221.

Although the corrective beam was irradiated onto the entire perimeter zone 222 in this embodiment, the corrective beam alternatively can expose only a portion, rather than all, of the perimeter zone 222. In the alternative case, e.g., the corrective beam is irradiated only on the portion of the perimeter zone 222 adjacent the pattern-exposure region 223 in FIG. 22(b). If this is done, e.g., the portion corresponding to the region 229 in FIG. 21(b) is a field on which a scattering body was formed.

Although exposure by the patterning beam and exposure by the corrective beam were performed using the same apparatus in this embodiment, it will be understood that these two exposures alternatively can be performed using different apparatus.

Figure 23:
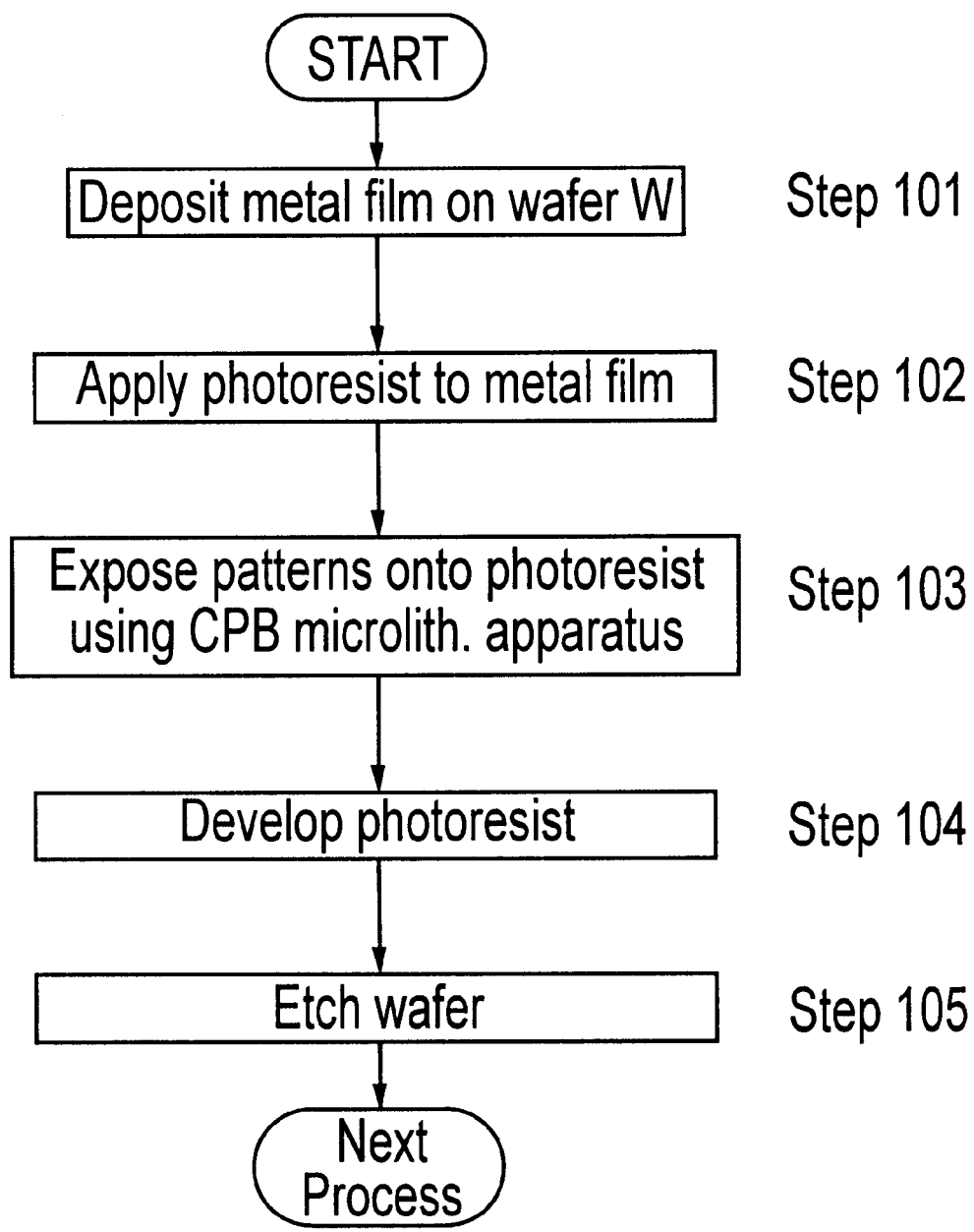
FIG. 23 is a block diagram of certain steps in a method for manufacturing a semiconductor device, involving a microlithography step according to the invention.

Next, an exemplary method for manufacturing a semiconductor device is described, wherein the method includes a microlithography step using a CPB microlithography apparatus according to the invention. The method is outlined in FIG. 23.

In Step 101, a metal film is deposited on the wafer W.

In Step 102, a photoresist is applied to the metal film deposited on the wafer W.

In Step 103, the elements of a pattern defined by a reticle R are exposed sequentially onto the wafer W using the CPB microlithography apparatus.

In Step 104, the photoresist (with imprinted pattern) is developed.

In Step 105, the wafer W is etched using the developed resist as a mask. During etching, elements corresponding to the features of the pattern defined by the reticle R are formed on the wafer W.

After completing Step 105, other circuits (layers) can be formed on the wafer W as required atop the layer formed in Steps 101–105 until manufacture of the respective semiconductor devices on the wafer is completed.

Whereas the invention has been described in connection with multiple representative embodiments, it will be understood that the invention is not limited to those embodiments. On the contrary, the invention is intended to encompass all alternatives, modifications, and equivalents as may be included in the spirit and scope of the invention as defined by the appended claims.

What is claimed is:

1. A microlithographic reticle defining a pattern to be transferred to a wafer, comprising:
    a pattern field comprising multiple circuit subfields in which are disposed respective circuit elements of a circuit pattern defined by the reticle; and
    at least one alignment subfield in which a respective alignment pattern is disposed, the alignment subfield being disposed outside the pattern field, but adjacent a respective circuit subfield, at a position at which the respective alignment pattern would be transfer-exposed from the reticle onto a scribe line of the pattern transfer-exposed on the wafer from the reticle.

2. The reticle of claim 1, comprising multiple alignment subfields disposed at respective positions around the pattern field.

3. The reticle of claim 1, wherein the alignment pattern is disposed at a distance from an adjacent boundary of the alignment subfield, the distance being a function of a magnitude of proximity effect otherwise imparted to the circuit pattern by an exposure dose applied to the alignment pattern.

4. The reticle of claim 1, wherein:
    the pattern field is circumscribed by a pattern-field boundary collectively defined by respective sides of peripheral circuit subfields of the pattern field; and
    the alignment pattern is situated a distance from an adjacent portion of the pattern-field boundary, the distance being a function of a magnitude of proximity effect otherwise imparted to the circuit pattern by an exposure dose applied to the alignment pattern.

5. A reticle for use in charged-particle-beam microlithography, comprising:
    circuit elements to be exposed onto a wafer by a charged particle beam; and
    an alignment pattern to be exposed onto the wafer by the charged particle beam, the alignment pattern being disposed adjacent respective circuit elements but at a distance from the adjacent circuit elements, the distance being a function of a magnitude of proximity effect otherwise imparted to the circuit elements by an exposure dose applied to the alignment pattern.

6. The reticle of claim 5, wherein the proximity effect otherwise imparted to the circuit elements is of a magnitude that would be manifest on circuit elements larger than a threshold size.

7. A reticle for use in charged-particle-beam microlithography, comprising:
    a pattern field segmented into multiple pattern subfields each defining a respective portion of a pattern defined by the pattern field, each respective portion comprising at least one respective pattern element; and
    a scribe area surrounding the pattern field, the scribe area comprising at least one alignment subfield defining an alignment-mark pattern, the alignment subfield being situated adjacent a closest pattern subfield situated in the pattern field.

8. The reticle of claim 7, wherein the alignment-mark pattern is located a distance from the respective elements defined in the closest pattern subfield, the distance being greater than a threshold value sufficient to maintain a proximity effect of the respective elements and the alignment mark with each other below a target magnitude.

9. A charged-particle-beam microlithography apparatus for transferring a pattern, defined by a reticle segmented into circuit subfields and at least one alignment subfield, from the reticle to a sensitive substrate, the apparatus comprising:

an illumination system configured and situated to illuminate the circuit subfields and alignment subfield on the reticle with a charged particle beam;

a projection system configured and situated to deflect the charged particle beam propagating from the alignment subfield to a substrate, the alignment subfield being situated adjacent a respective circuit subfield that defines a respective pattern element and defining an alignment mark; and a controller connected to the projection system, the controller being configured to cause the projection system to deflect the charged particle beam propagating from the alignment subfield, the deflection of the beam having a magnitude that is a function of a proximity effect that would otherwise be manifest between the pattern element in the adjacent circuit subfield and the alignment mark due to an exposure dose applied to the alignment mark.

10. The apparatus of claim 9, wherein the controller is configured to cause the projection system to deflect the charged particle beam from the alignment subfield to a position, on the substrate, relative to a projected position of the adjacent circuit subfield where the proximity effect is less than a threshold value.

11. The apparatus of claim 9, wherein the controller is configured to cause the projection system to deflect the charged particle beam from the alignment subfield so as to project an image of the alignment mark onto the substrate at a position, relative to a projected position of the pattern element defined in the adjacent circuit subfield, where the proximity effect is less than a threshold value.

12. A method for manufacturing a semiconductor device, comprising:

depositing a layer on a wafer;

applying a resist to the layer;

exposing a pattern onto the resist using a CPB microlithography apparatus as recited in claim 9;

developing the resist; and etching the layer.

13. In a method for performing microlithography of a circuit pattern, defined on a segmented reticle, onto a sensitive substrate using a charged particle beam, a method for reducing proximity effects, comprising:

providing a reticle comprising a pattern field including multiple circuit subfields in which are disposed respective circuit elements of a circuit pattern defined by the reticle, and at least one alignment subfield in which a respective alignment pattern is disposed, the alignment subfield being disposed outside the pattern field but adjacent a respective circuit subfield;

projecting the respective adjacent circuit subfield onto the sensitive substrate; and projecting the alignment subfield onto the sensitive substrate such that a projected image of the alignment pattern is located a distance from elements defined by the respective adjacent circuit subfield at which a proximity effect of the elements with the alignment pattern is maintained below a pre-determined threshold level.

14. The method of claim 13, wherein:

the circuit subfields are projected into a pattern field on the substrate; and the alignment subfield is projected into a scribe area on the substrate, the scribe area surrounding the pattern field.

15. The method of claim 14, wherein:

the alignment subfield has a edge and the adjacent circuit subfield has a proximal edge; and the alignment subfield is projected into the scribe area such that the edge of the alignment subfield is located a prescribed distance from the proximal edge of the adjacent circuit subfield.

16. The method of claim 13, wherein the elements are corrected based on a magnitude of the proximity effect imparted to the elements by an exposure dose to the alignment pattern.

17. In a method for performing charged-particle-beam microlithography in which a circuit pattern, defined in a chip field on a patterning reticle, is projection-transferred to a corresponding chip field on a sensitive substrate, a method for correcting a proximity effect arising from backscattering of electrons in the substrate, the method comprising:

providing a corrective reticle corresponding to the patterning reticle;

irradiating the charged particle beam through the corrective reticle onto the substrate such that the beam irradiating the substrate is incident on at least a portion of a perimeter zone located outside the chip field as projected onto the substrate.

18. The method of claim 17, further comprising the step of establishing a width of the perimeter zone based on an acceleration voltage of the charged particle beam incident on the reticle.

19. A corrective reticle for reducing a proximity effect in a chip field as projected onto a sensitive substrate using a charged particle beam, the corrective reticle being configured to mask and transmit respective portions of the charged particle beam such that the transmitted portion of the beam irradiates at least a portion of a perimeter zone located outside the chip field as projected onto the substrate.

20. The corrective reticle of claim 19, configured to pass a perimeter-zone-illuminating portion of the charged particle beam, the perimeter-zone-illuminating portion having a width, as irradiated onto the substrate, that is a function of an acceleration voltage applied to the beam irradiating the corrective reticle.

21. In a method for performing charged-particle-beam microlithography of a pattern, defined in a chip pattern on a reticle, to a sensitive substrate, a method for forming an alignment mark on the substrate, the method comprising:

establishing a chip-pattern area on the sensitive substrate in which an image of the chip pattern, as defined on the reticle, is exposed;

defining an alignment mark on a reticle;

using the charged particle beam, exposing an image of the alignment mark onto the substrate, the image of the alignment mark being exposed at a location, outside the image of the chip pattern, situated at least a pre-determined threshold distance from the image of the chip pattern, the threshold distance being sufficient to maintain a magnitude of proximity effects of the image of the alignment mark with features of the chip pattern below a threshold level.

22. The method of claim 21, wherein:

the charged particle beam is an electron beam; and the threshold distance ($\delta_d$, in $\mu$m) is determined to be $A_v-35$, wherein $A_v$ is an acceleration voltage (in KV) applied to the charged particle beam as used for exposure.

23. A method for manufacturing a semiconductor device, comprising the step of exposing an image of an alignment mark as recited in claim 21.

24. In a method for performing charged-particle-beam microlithography of a pattern, defined in a chip pattern on a reticle, to a sensitive substrate, a method for reducing proximity effects arising between an alignment mark, located outside the chip pattern, and one or more elements of a pattern as exposed onto the substrate, the method comprising performing proximity-effect correction considering the alignment mark and the chip pattern as a single unit.

25. The method of claim 24, wherein the proximity-effect correction is performed by reshaping one or more of the alignment mark and an element of the chip pattern.

26. The method of claim 24, wherein the proximity-effect correction is performed by controlling a dose of the charged particle beam as incident on the substrate.

27. The method of claim 24, wherein the proximity-effect correction is performed by ghosting.

28. A method for manufacturing a semiconductor device, comprising the step of proximity-effect correction as recited in claim 24.

* * * * *

UNITED STATES PATENT AND TRADEMARK OFFICE
CERTIFICATE OF CORRECTION

PATENT NO.    : 6,528,806 B1
DATED         : March 4, 2003
INVENTOR(S)   : Kawamura It is certified that error appears in the above-identified patent and that said Letters Patent is hereby corrected as shown below:

Column 9,
Line 51, "a certain features" should be -- certain features --.

Column 18,
Between lines 61 and 62, insert the following missing text as a new paragraph:
-- Desirably, the threshold distance $\delta_d$ (in $\mu$m) is equal to $A_v$ - 35, wherein $A_v$ (in KV) is the beam-acceleration voltage of the beam used to perform pattern exposure. --

Column 21,
Line 38, "respect" should be -- respective --.

Column 22,
Lines 7-8, "to 15 the subfields on" should be -- to the subfields on --.

Column 26,
Line 5, "a edge" should be -- an edge --.

Signed and Sealed this

Twenty-third Day of December, 2003

JAMES E. ROGAN
*Director of the United States Patent and Trademark Office*